United States Patent
Pieh et al.

(10) Patent No.: US 10,355,231 B2
(45) Date of Patent: Jul. 16, 2019

(54) ORGANIC LIGHT EMITTING DISPLAY DEVICE

(71) Applicant: LG Display Co., Ltd., Seoul (KR)

(72) Inventors: Sung Hoon Pieh, Seoul (KR); Chang Wook Han, Seoul (KR); Hong Seok Choi, Seoul (KR); Ki-Woog Song, Gyeonggi-do (KR); So Yeon Ahn, Seoul (KR); Seung Hyun Kim, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/205,025

(22) Filed: Nov. 29, 2018

(65) Prior Publication Data

US 2019/0097153 A1     Mar. 28, 2019

Related U.S. Application Data

(62) Division of application No. 14/873,414, filed on Oct. 2, 2015, now Pat. No. 10,177,330.

(30) Foreign Application Priority Data

Dec. 17, 2014 (KR) .................. 10-2014-0182517

(51) Int. Cl.
*H01L 51/50* (2006.01)
*H01L 51/52* (2006.01)

(52) U.S. Cl.
CPC ........ *H01L 51/504* (2013.01); *H01L 51/5044* (2013.01); *H01L 51/5218* (2013.01); *H01L 51/5221* (2013.01); *H01L 51/5265* (2013.01); *H01L 2251/558* (2013.01)

(58) Field of Classification Search
CPC combination set(s) only.
See application file for complete search history.

(56) References Cited

U.S. PATENT DOCUMENTS

| | | |
|---|---|---|
| 2007/0222376 A1 | 9/2007 | Ohsawa et al. |
| 2011/0073844 A1 | 3/2011 | Pieh et al. |
| 2012/0256208 A1 | 10/2012 | Hatano |
| 2013/0069077 A1 | 3/2013 | Song et al. |
| 2013/0119357 A1 | 5/2013 | Kim et al. |
| 2013/0320837 A1* | 12/2013 | Weaver ............. H05B 33/14 313/504 |
| 2014/0061604 A1 | 3/2014 | Seo et al. |
| 2014/0306207 A1* | 10/2014 | Nishimura ......... C07D 401/14 257/40 |
| 2015/0155511 A1 | 6/2015 | Ohsawa et al. |
| 2016/0111475 A1 | 4/2016 | Ohara et al. |

FOREIGN PATENT DOCUMENTS

| | | |
|---|---|---|
| KR | 10-2011-0035048 A | 4/2011 |
| WO | 2013150968 A1 | 10/2013 |

* cited by examiner

*Primary Examiner* — Ratisha Mehta
(74) *Attorney, Agent, or Firm* — Morgan, Lewis & Bockius LLP

(57) ABSTRACT

An organic light emitting display device comprises two emission portions between first and second electrodes, wherein at least one among the two emission portions includes two emitting layers, whereby efficiency and a color reproduction ratio may be improved.

26 Claims, 14 Drawing Sheets

ORGANIC LIGHT EMITTING DISPLAY DEVICE

CROSS REFERENCE TO RELATED APPLICATIONS

This application is a Divisional of U.S. patent application Ser. No. 14/873,414, filed Oct. 2, 2015, which claims the benefit of the Korean Patent Application No. 10-2014-0182517, filed on Dec. 17, 2014, both of which are hereby incorporated by reference for all purposes as if fully set forth herein.

BACKGROUND OF THE INVENTION

Field of the Invention

The present invention relates to an organic light emitting display device, and more particularly, to an organic light emitting display device that may improve efficiency and a color reproduction ratio.

Discussion of the Related Art

Recently, with the advancement of the information age, a display field for visually displaying an electric information signal has been rapidly developed. In response to this trend, various flat panel display devices having excellent properties of a thin profile, a light weight, and low power consumption have been developed.

Detailed examples of the flat panel display devices include liquid crystal display (LCD) devices, plasma display panel (PDP) devices, field emission display (FED) devices, and organic light emitting display (OLED) devices.

Particularly, the organic light emitting display device is a self light emitting diode, and is more advantageous than the other flat panel display devices in view of a fast response speed, high light emission efficiency, high luminance and a broad viewing angle.

The organic light emitting diode is based on that an organic emitting layer is formed between two electrodes, electrons and holes from the two electrodes are injected into the organic emitting layer to generate an exciton through combination of the electrons and the holes, and light is generated when the exciton is transited from the excited state to a ground state.

RELATED ART REFERENCE

Patent Reference (Patent reference 1) 1. White organic light emitting diode (Korean Patent Application No. 10-2009-0092596)

An organic light emitting diode emitting white light may have a structure of two emitting layers of which colors are complementary to each other. This structure generates a difference between a wavelength area of an electroluminescence (EL) peak of each emitting layer and a transmissive area of a color filter when white light passes through the color filter. Therefore, a problem occurs in that it is difficult to obtain a desired color reproduction ratio as a color range, which may be displayed, becomes narrow.

For example, in case of an organic light emitting diode emitting white light, which includes a blue emitting layer and a white-green emitting layer, an EL peak wavelength is formed in a blue wavelength area and a yellow-green wavelength area, whereby white light is emitted. However, transmittance of the blue wavelength area becomes lower than transmittance of a red or green wavelength area when the white light passes through red, green and blue color filters, whereby emission efficiency and a color reproduction ratio are lowered. Also, the blue emitting layer is formed of a fluorescent emitting material, and the yellow emitting layer is formed of a phosphorescence emitting material. Emission efficiency of the yellow phosphorescence emitting layer is relatively higher than emission efficiency of the blue fluorescent emitting layer, whereby emission efficiency and the color reproduction ratio are reduced due to a difference in efficiency between the yellow phosphorescence emitting layer and the blue fluorescent emitting layer.

Also, in case of a bottom emission type device, a polarizer should be used to lower reflectance of an external light source. A problem occurs in that luminance is reduced in the range of 60%, approximately, due to the use of the polarizer.

In this respect, the inventors of the present invention have recognized the aforementioned problems and invented an organic light emitting display device of a new structure, which may improve efficiency and a color reproduction ratio.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device that includes two emission portions, one among two emission portions having two emitting layers, to improve efficiency and a color reproduction ratio.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device comprises first and second electrodes facing each other on a substrate; a first emission portion on the first electrode; and a second emission portion on the first emission portion, wherein the first emission portion or the second emission portion includes one among a green emitting layer and a yellow-green emitting layer and a red emitting layer to improve any one among green efficiency, red efficiency, and color shift rate property.

The first emission portion includes the green emitting layer and the red emitting layer.

The second emission portion includes a dark blue emitting layer.

The green emitting layer is closer to the first electrode than the red emitting layer.

The organic light emitting display device further comprises organic layers between the first electrode and the second electrode, wherein the organic layers have a thickness in the range of 200 nm to 230 nm to improve red efficiency.

The organic light emitting display device further comprises organic layers between the first electrode and the second electrode, wherein the organic layers have a thickness in the range of 320 nm to 350 nm to improve the color shift rate property.

The red emitting layer is closer to the first electrode than the green emitting layer.

The organic light emitting display device further comprises organic layers between the first electrode and the second electrode, wherein the organic layers have a thickness in the range of 200 nm to 230 nm to improve green efficiency.

The second emission portion includes the green emitting layer and the red emitting layer.

The red emitting layer is closer to the second electrode than the green emitting layer.

The first emission portion includes a dark blue emitting layer.

The organic light emitting display device further comprises organic layers between the first electrode and the second electrode, wherein the organic layers have a thickness in the range of 320 nm to 350 nm to improve green efficiency.

The first emission portion includes the yellow-green emitting layer and the red emitting layer.

The second emission portion includes a blue emitting layer.

The yellow-green emitting layer is closer to the first electrode than the red emitting layer.

The organic light emitting display device further comprises organic layers between the first electrode and the second electrode, wherein the organic layers have a thickness in the range of 200 nm to 240 nm to improve red efficiency.

The organic light emitting display device further comprises organic layers between the first electrode and the second electrode, wherein the organic layers have a thickness in the range of 340 nm to 370 nm to improve the color shift rate property.

Each of the first electrode and the second electrode includes one among ITO (indium tin oxide), IZO (indium zinc oxide), and IGZO (indium gallium zinc oxide).

Each of the first electrode and the second electrode includes one among a reflective electrode and a transflective electrode.

Each of the first emission portion and the second emission portion includes electroluminescence (EL) peaks in the ranges of 440 nm to 480 nm, 530 nm to 580 nm, and 600 nm to 650 nm.

In another aspect, an organic light emitting display device comprises first and second electrodes facing each other on a substrate; a first emission portion on the first electrode; and a second emission portion on the first emission portion, wherein at least one among the first emission portion and the second emission portion includes two emitting layers, and the first emission portion and the second emission portion have emission characteristics that exhibit three EL peaks. The first emission portion includes the two emitting layers, and the second emission portion includes a single emitting layer.

The two emitting layers in the first emission portion include a green emitting layer and a red emitting layer, and the single emitting layer in the second emission portion includes a dark blue emitting layer.

The two emitting layers in the first emission portion include a yellow-green emitting layer and a red emitting layer, and the single emitting layer in the second emission portion includes a blue emitting layer.

The first emission portion includes a single emitting layer, and the second emission portion includes two emitting layers.

The single emitting layer in the first emission portion includes a dark blue emitting layer, and the two emitting layers in the second emission portion include a green emitting layer and a red emitting layer.

The three EL peaks have wavelengths in the ranges of 440 nm to 480 nm, 530 nm to 580 nm, and 600 nm to 650 nm.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1A:
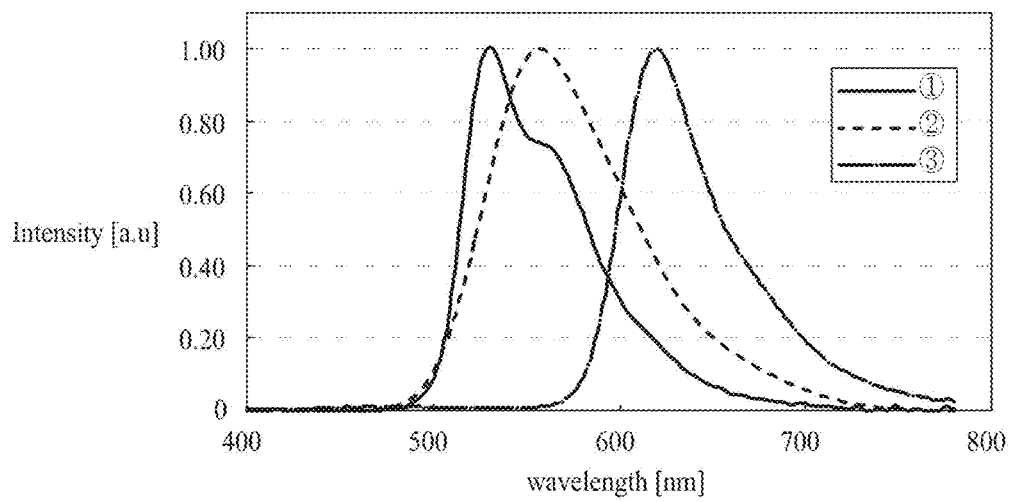
FIGS. 1A and 1B are diagrams illustrating a PL spectrum of an emitting layer according to an example embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the embodiments of the present invention will be described in detail with reference to the accompanying drawings.

Since an emitting layer constituting an organic light emitting diode includes at least one host and at least one dopant, the emitting layer will be described with reference to FIG. 1 illustrating PhotoLumincescence (PL) spectrum of the emitting layer. In this embodiment, a structure of an organic light emitting display device according to various embodiments is suggested in which luminance and an aperture ratio are improved using a top emission type and efficiency and a color reproduction ratio are improved.

In this case, an ElectroLuminescence (EL) peak of the organic light emitting display device that includes the organic light emitting diode is determined by the product of PhotoLumincescence (PL) peak displaying a unique color of an emitting layer and Emittance (EM) peak of organic layers constituting the organic light emitting diode. The emittance (EM) peak of the organic layers is affected by thicknesses and optical properties of the organic layers.

Figure 1B:
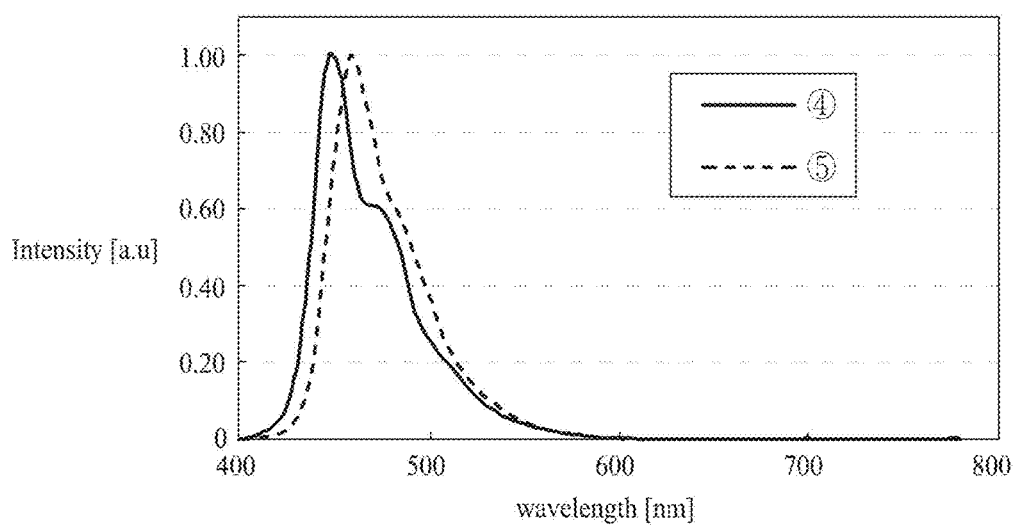

FIGS. 1A and 1B are diagrams illustrating a PL spectrum of an emitting layer, which constitutes an organic light emitting diode.

FIG. 1A illustrates a PL spectrum of a phosphorescence green dopant (marked with ①), a phosphorescence yellow-green dopant (marked with ②) and a phosphorescence red dopant (marked with ③).

FIG. 1B illustrates a PL spectrum of a deep blue dopant (marked with ④) and a blue dopant (marked with ⑤).

As already described, the organic light emitting diode emits light as exciton generated by recombination of holes and electrons emits energy. Electroluminescence for emitting light has two properties, that is, fluorescence and phosphorescence, wherein the fluorescence emits light as the exciton is transited from a singlet level to an excited state, and the phosphorescence emits light as the exciton is transited from a triplet level to an excited state.

As shown in FIG. 1A, a phosphorescence green dopant ① of which maximum wavelength of a PL peak is 532 nm is used, a yellow-green dopant ② of which maximum wavelength of a PL peak is 556 nm is used, and a red dopant ③ of which maximum wavelength of a PL peak is 620 nm.

As shown in FIG. 1B, a deep blue dopant ④ of which maximum wavelength of a PL peak is 444 nm is used, and a blue dopant ⑤ of which maximum wavelength of a PL peak is 456 nm is used. Since the deep blue dopant ④ is arranged in a wavelength area shorter than that of the blue dopant ⑤, it may be favorable for improvement of a color reproduction ratio and luminance.

Hereinafter, the organic light emitting diode of various embodiments to which dopants described in FIGS. 1A and 1B are applied will be described.

The present invention suggests an organic light emitting diode of various embodiments, which includes two emission portions, at least one among having two emitting layers. The two emitting layers may include one among a green emitting layer and a yellow-green emitting layer, and a red emitting layer.

Figure 2:
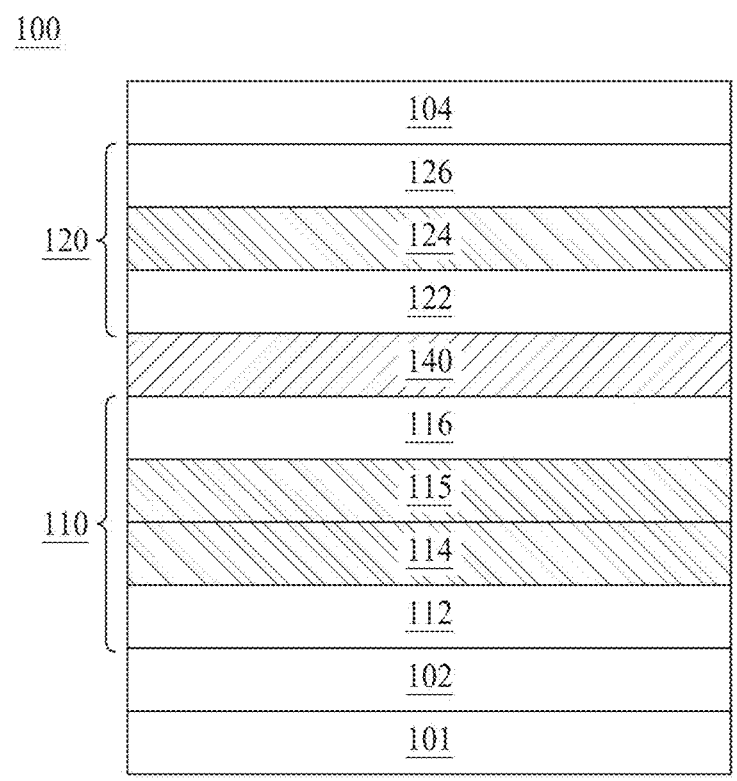
FIG. 2 is a brief cross-sectional diagram illustrating an organic light emitting diode according to a first example embodiment and a second example embodiment of the present invention.

FIG. 2 is a brief cross-sectional diagram illustrating an organic light emitting diode according to a first example embodiment and a second example embodiment of the present invention.

The organic light emitting diode 100 shown in FIG. 2 includes first and second electrodes 102 and 104 on a substrate 101, and first and second emission portions 110 and 120 between the first electrode 102 and the second electrode 104.

The first electrode 102 is a positive electrode for supplying holes, and may be formed of, but is not limited to, Au, Ag, Al, Mo, Mg, or their alloy. Alternatively, the first electrode 102 may be formed of, but is not limited to, ITO (indium tin oxide), IZO (indium zinc oxide), or IGZO (indium gallium zinc oxide). A reflective electrode may additionally be provided below the first electrode 102 to reflect light toward the second electrode 104.

The second electrode 104 is a negative electrode for supplying electrons, and may be formed of, but is not limited to, ITO (indium tin oxide), IZO (indium zinc oxide), or IGZO (indium gallium zinc oxide), which is a transparent conductive material such as TCO (transparent conductive oxide). A buffer layer may additionally be provided below the second electrode 104 to prevent the second electrode 104 from being damaged by sputtering when the second electrode 104 is formed.

Alternatively, each of the first and second electrodes 102 and 104 may be formed of, but is not limited to, one among ITO (indium tin oxide), IZO (indium zinc oxide), and IGZO (indium gallium zinc oxide).

The first electrode 102 may be referred to as anode and the second electrode 104 may be referred to as cathode.

A top emission type, in which the first electrode 102 is a reflective electrode and the second electrode 104 is a transflective electrode, will be applied to the present invention.

In the first and second embodiments of the present invention, the first emission portion includes two emitting layers, and the second emission portion includes a single emitting layer. The two emitting layers in the first emission portion include a green emitting layer and a red emitting layer, and the single emitting layer in the second emission portion includes a deep blue emitting layer.

The first emission portion 110 may include a first hole transporting layer (HTL) 112, a first emitting layer (EML) 114, a second emitting layer (EML) 115, and a first electron transporting layer (ETL) 116.

The first emission portion 110 may further include a hole injecting layer (HIL) above the first electrode 102. The hole injecting layer (HTL) is formed above the first electrode 102, and serves to actively inject holes from the first electrode 102.

The first hole transporting layer (HTL) 112 supplies the holes from the hole injecting layer (HIL) to the first emitting layer (EML) 114 and the second emitting layer (EML) 115. The first electron transporting layer (ETL) 116 supplies electrons from the second electrode 104 to the first emitting layer (EML) 114 and the second emitting layer (EML) 115 of the first emission portion 110.

The first hole transporting layer (HTL) 112 may include one or more layers or one or more materials. The first hole transporting layer (HTL) 112 may be formed of, but is not limited to, any one or more among NPD(N,N-dinaphthyl-N,N'-diphenylbenzidine), TPD (N,N-diphenyl-N,N'-di(3-methylphenyl)-1,1'-biphenyl-4,4'-diamine), Spiro-TAD(2,2',7,7'-tetrakis(N,N-diphenlylamino)-9,9'-spirofluorene and MTDATA(4,4',4"-tris(N-3-methylphenyl-N-phenylamino)triphenylamine).

The hole injection layer (HIL) may be formed of, but is not limited to, MTDATA(4,4',4"-tris(N-3-methylphenyl-N-phenylamino)triphenylamine), CuPc(phthalocyanine, copper complex) or PEDOT/PSS (poly(3,4-ethylenedioxythiphene/polystyrene sulfonate).

The holes supplied through the first hole transporting layer (HTL) 112 and the electrons supplied through the first electron transporting layer (ETL) 116 are recombined with each other in the first emitting layer (EML) 114 and the second emitting layer (EML) 115, whereby light is generated.

The first electron transporting layer (ETL) 116 may include one or more layers or one or more materials. The first electron transporting layer (ETL) 116 may be formed of, but is not limited to, any one or more among Alq3(tris(8-hydroxyquinolinato)aluminum), PBD(2-(4-biphenyl)5-(4-tert-butylphenyl)-1,3,4-oxadiazole), TAZ(3-(4-biphenyl)-4-phenyl-5-tert-butylphenyl-1,2,4-triazole), Liq(8-hydroxyquinolinato-lithium) and BAlq(Bis(2-methyl-8-quinolinolate)-4-(phenylphenolato)aluminum).

The first emitting layer (EML) 114 constituting the first emission portion 110 includes a green emitting layer, and the second emitting layer (EML) 115 includes a red emitting layer. The green emitting layer may be closer to the first electrode 102 than the red emitting layer.

The first emitting layer (EML) 114 of the first emission portion 110 includes a green emitting layer to which a green dopant of which maximum wavelength of a PL peak is 532 nm is applied. And, the second emitting layer (EML) 115 includes a red emitting layer to which a red dopant of which maximum wavelength of a PL peak is 620 nm is applied.

The dopant in the first emitting layer (EML) 114 may be formed of, but is not limited to, Ir(ppy)3(Tris(2-phenylpyridine)iridium(III)). And, the dopant in the second emitting layer (EML) 115 may be formed of, but is not limited to, Ir(piq)3(Tris(1-phenylisoquinoline)iridium(III)), Ir(piq)2(acac)(Bis(1-phenylisoquinoline)(acetylacetonate)iridium (III)), Ir(btp)2(acac)(Bis)2-benzo[b]thiophen-2-yl-pyridine)(acetylacetonate)iridium(III)), or Ir(BT)2(acac)(Bis(2-phenylbenzothazolato)(acetylacetonate)iridium(III)).

A charge generating layer (CGL) 140 may further be provided between the first emission portion 110 and the second emission portion 120. The charge generating layer (CGL) 140 controls charge balance between the first emission portion 110 and the second emission portion 120. The charge generating layer 140 may include an N type charge generating layer (N-CGL) and a P type charge generating layer (P-CGL). The N type charge generating layer (N-CGL) serves to inject electrons to the first emission portion 110, and the P type charge generating layer (P-CGL) serves to inject holes to the second emission portion 120. The charge generating layer (CGL) 140 may be formed of a single layer.

The second emission portion 120 may include a second hole transporting layer (HTL) 122, a third emitting layer (EML) 124, and a second electron transporting layer (ETL) 126.

The second emission portion 120 may further include an electron injecting layer (EIL) above the second electron transporting layer (ETL) 126. The electron injecting layer (EIL) is formed by doping an alkali metal on the electron transporting layer (ETL). The alkali metal may be formed of, but is not limited to, Li, Na, Mg, or Ca. The electron transporting layer (ETL) may be formed of, but is not limited to, a fused aromatic ring based organic material, which includes a heterocyclic ring. The alkali metal may be doped in the range of 0.6% or more and 2.0% or less.

The second emission portion 120 may further include a hole injecting layer (HIL).

The second hole transporting layer (HTL) 122 may be formed of, but is not limited to, the same material as that of the first hole transporting layer (HTL) 112.

The second hole transporting layer (HTL) 122 may include, but is not limited to, one or more layers or one or more materials.

The second electron transporting layer (ETL) 126 may be formed of, but is not limited to, the same material as that of the first electron transporting layer (ETL) 116.

The second electron transporting layer (ETL) 126 may include one or more layers or one or more materials.

The third emitting layer (EML) 124 of the second emission portion 120 includes a dark blue emitting layer. The third emitting layer (EML) 124 includes a dark blue emitting layer to which a dark blue dopant of which maximum wavelength of a PL peak is 444 nm is applied. The dopant in the third emitting layer (EML) 124 may be formed of, but is not limited to, an iridium based material.

As previously described, the organic light emitting diode emits light as exciton generated by recombination of holes and electrons emits energy. Electroluminescence for emitting light has two properties, that is, fluorescence and phosphorescence, wherein the fluorescence emits light as the exciton is transited from a singlet level to an excited state, and the phosphorescence emits light as the exciton is transited from a triplet level to an excited state. In this case, one exciton is transited in the singlet level while three excitons are transited in the triplet level, whereby the fluorescence has efficiency of 25% and the phosphorescence has efficiency of 75%. Triplet-Triplet Annihilation (TTA) and delayed fluorescence should be used to improve internal quantum efficiency of the fluorescence type electroluminescence. The TTA represents that collision occurs between triplet excitons having a long lifetime as the excitons are adjacent to each other at high density, and some of the triplet excitons are transited to singlet excitons to emit light. The triplet excitons are transited to the singlet excitons by the TTA to emit light, whereby internal quantum efficiency may be improved. For example, transition and collision of the singlet excitons, which are caused by collision of the triplet excitons having a lifetime longer than a lifetime of the singlet excitons directly excited, make delayed fluorescence. Electroluminescence efficiency may be more improved by the delayed fluorescence.

Therefore, the TTA and delayed fluorescence are used to improve efficiency of the dark blue emitting layer which is the third emitting layer (EML) 124 of the second emission portion 120. As the delayed fluorescence through the TTA contributes to electroluminescence based on the singlet excitons, internal quantum efficiency (IQE) may be improved from 25% to 40%. In order that the TTA efficiently occurs in the emitting layer, if an energy difference (singlet-triplet exchange energy; ΔEst) between a singlet level and a triplet level of a host and a dopant of the emitting layer becomes smaller, energy transition from the triplet to the singlet occurs easily. In order that the triplet excitons are formed effectively in the emitting layer, a triplet energy of the hole transporting layer (HTL) and the electron transporting layer (ETL) should be higher than the triplet energy of the host of the emitting layer. That is, the triplet energy of the second hole transporting layer (HTL) 122 and the second electron transporting layer (ETL) 126 is adjusted to be higher than the triplet energy of the host of the dark blue emitting layer which is the third emitting layer (EML) 124 as much as 0.01 eV to 0.4 eV, whereby blue efficiency may be more improved. Although the dark blue emitting layer has been described exemplarily, the TTA and the delayed fluorescence are applied to all the embodiments of the present invention to improve efficiency of the dark blue emitting layer or the blue emitting layer.

In all the embodiments of the present invention, the structure of the charge generating layer (CGL) has been optimized. Although the structure of the charge generating layer (CGL) is described in the first and second embodiments of the present invention, the structure will be applied to the third to sixth embodiments of the present invention. As previously described, the charge generating layer includes an N type charge generating layer and a P type charge generating layer.

The N type charge generating layer (N-CGL) may be formed of, but is not limited to, an organic layer doped with alkali metal such as Li, Na, K or Cs or alkali earth metal such as Mg, Ca, Sr, Ba or Ra. The alkali metal or the alkali earth metal may be doped in the range of 0.6% or more and 2.0% or less.

The P type charge generating layer (P-CGL) may be formed of, but is not limited to, at least one organic host and at least one organic dopant. At least one P host may include either the same material as that of the second hole transporting layer (HTL) 122 which is the hole transporting layer (HTL) adjacent thereto or a material different from that of the hole transporting layer (HTL). The triplet energy of the hole transporting layer (HTL) is 2.5 eV or more, and in this range, may prevent electrons from being moved and prevent the triplet excitons from being diffused. Also, a HOMO (highest occupied molecular orbital) level of the P host is adjusted to be proximate to a HOMO level of the second hole transporting layer (HTL) 122, whereby injection of the holes to the emitting layer may be made. Moreover, the triplet excitons of the phosphorescence emitting layer of the second emission portion may be prevented from being diffused into the second hole transporting layer (HTL) 122, whereby a lifetime of the organic light emitting diode may be improved. For example, the HOMO level of the P host may be in the range of 4.5 eV to 6.0 eV, and a LUMO (lowest unoccupied molecular orbital) level of the P dopant may be in the range of 4.5 eV to 6.0 eV. The P type charge generating layer (P-CGL) may have a thickness in the range of 5 nm to 20 nm.

In the organic light emitting display device that includes the organic light emitting diode according to the first and second embodiments of the present invention, at least one among gate lines and data lines which define each pixel area, and a power line in parallel extended from any one among the gate lines and the data lines are arranged on a substrate, and a switching thin film transistor connected to the gate and data lines and a driving thin film transistor connected to the switching thin film transistor are arranged in each pixel area. The driving thin film transistor is connected to the first electrode 102.

The structure of the present invention is suggested through a contour map through optical simulation based on the organic light emitting diode shown in FIG. 2.

Figure 3:
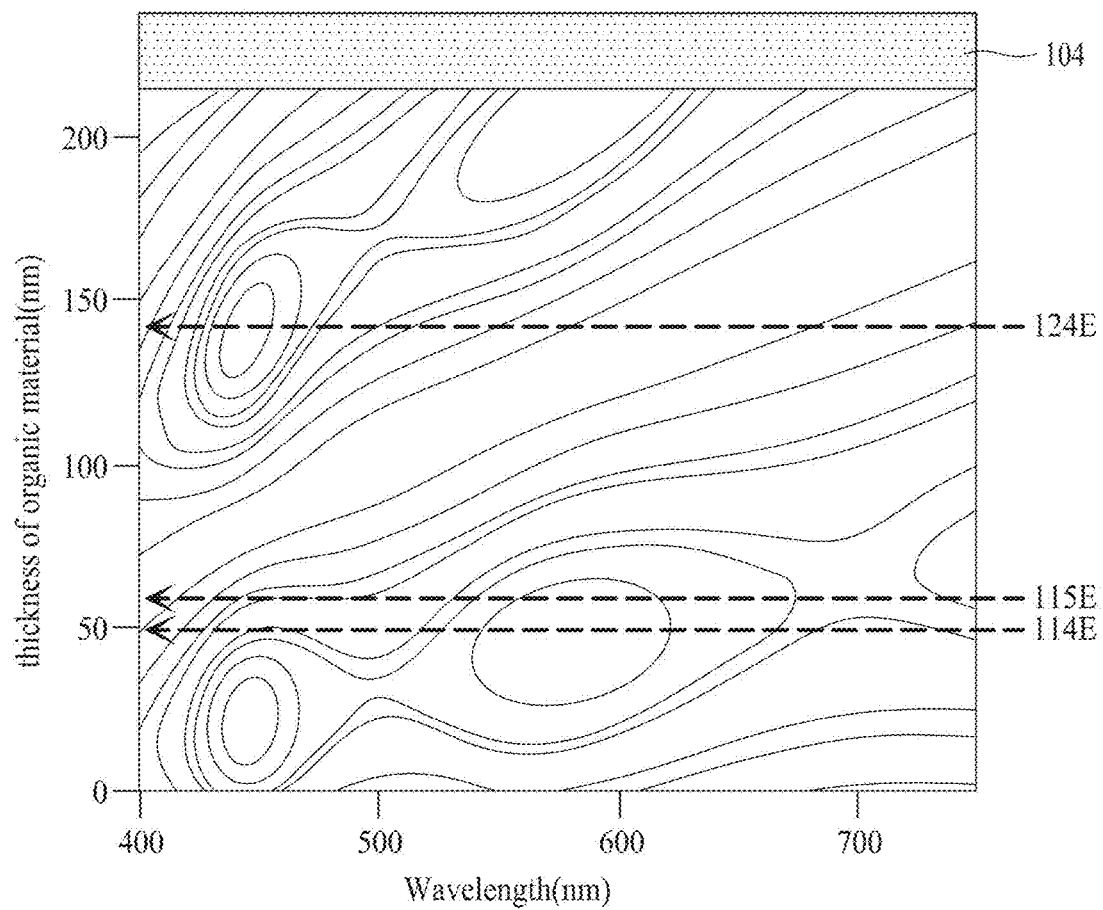
FIG. 3 is a diagram illustrating a contour map according to the first embodiment of the present invention.
Figure 4:
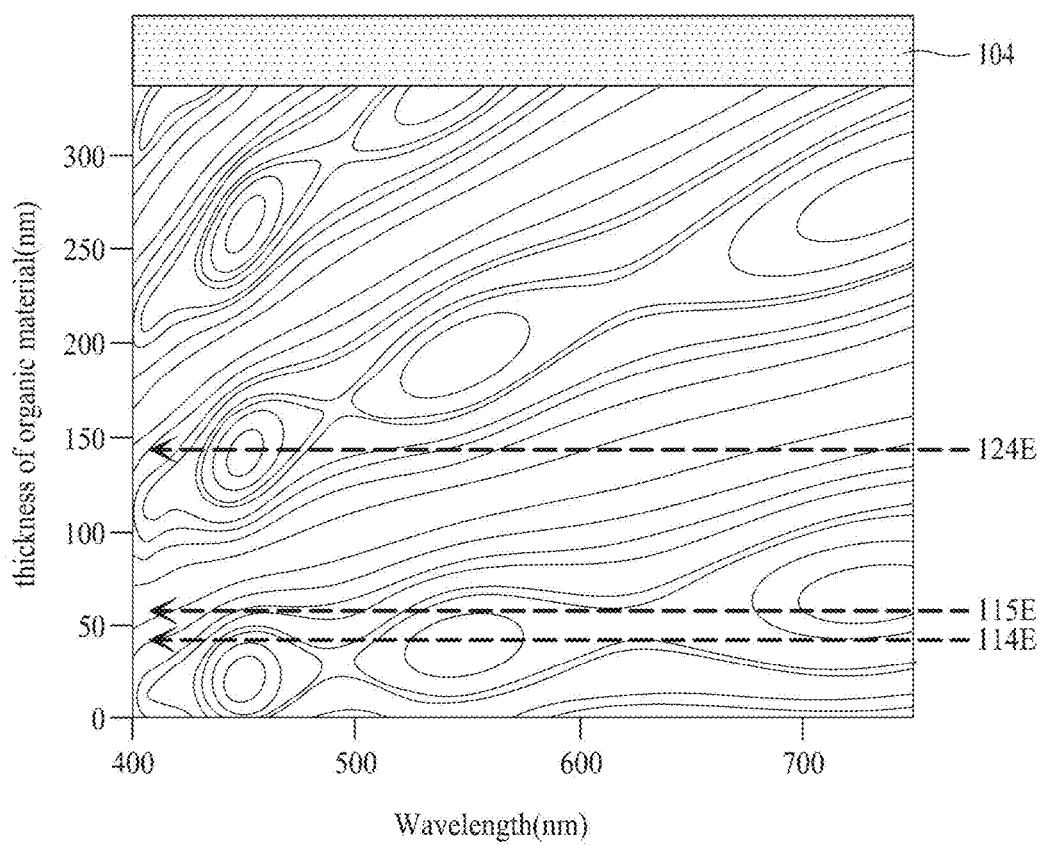
FIG. 4 is a diagram illustrating a contour map according to the second embodiment of the present invention.

FIG. 3 is a diagram illustrating a contour map according to the first embodiment of the present invention, and FIG. 4 is a diagram illustrating a contour map according to the second embodiment of the present invention.

In FIGS. 3 and 4, a horizontal axis represents a wavelength, and a vertical axis represents a thickness of an organic material. Although a unit of the thickness of the organic material is nanometer (nm) in FIGS. 3 and 4. The thickness of the organic material indicates the thickness of the organic layers arranged between the first electrode and the second electrode. The organic layers indicate organic layers constituting the first emission portion 110 and the second emission portion 120 as shown in FIG. 2, and include a hole transporting layer (HTL), an electron transporting layer (ETL), a charge generating layer (CGL), and an emitting layer (EML). If a buffer layer is further provided below the second electrode, the buffer layer is not included in the organic layers.

The organic light emitting diode shown in FIG. 2 is applied to the first embodiment of the present invention, and the thickness of the organic layers between the first electrode and the second electrode is in the range of 200 nm to 230 nm. The organic light emitting diode shown in FIG. 2 is applied to the second embodiment of the present invention, and the thickness of the organic layers between the first electrode and the second electrode is in the range of 320 nm to 350 nm.

As shown in FIG. 3, it is noted from the first embodiment of the present invention that the thickness of the organic layers between the first electrode and the second electrode is in the range of 200 nm to 230 nm. For example, the thickness of the organic layers between the first electrode and the second electrode may be adjusted to 215 nm. And, the thickness of the first electrode 102 may be in the range of 10 nm to 15 nm. The thickness of the second electrode 104 may be in the range of 100 nm to 1500 Å, for example, the thickness of the second electrode 104 may be 140 nm.

The location 114E of the first emitting layer (EML) of the first emission portion is in the range of 30 nm to 60 nm from the first electrode 102. For example, the location 114E of the first emitting layer (EML) may be at 50 nm from the first electrode 102. The location 115E of the second emitting layer (EML) is in the range of 50 nm to 90 nm from the first electrode 102. For example, the location 115E of the second emitting layer (EML) may be at 60 nm from the first electrode 102. The thickness of the first emitting layer (EML) 114 may be in the range of 20 nm to 300 Å, and the thickness of the second emitting layer (EML) 115 may be in the range of 5 nm to 10 nm.

The location 124E of the third emitting layer (EML) of the second emission portion is in the range of 120 nm to 160 nm from the first electrode 102. For example, the location 124E of the third emitting layer (EML) may be at 140 nm from the first electrode 102. The thickness of the third emitting layer (EML) 124 may be in the range of 20 nm to 30 nm.

As shown in FIG. 4, it is noted from the second embodiment of the present invention that the thickness of the organic layers between the first electrode 102 and the second electrode 104 is in the range of 320 nm to 350 nm. For example, the thickness of the organic layers between the first electrode 102 and the second electrode 104 may be set to 340 nm. And, the thickness of the first electrode 102 may be in the range of 10 nm to 15 nm. The thickness of the second electrode 104 may be in the range of 100 nm to 1500 Å, for example, the thickness of the second electrode 104 may be 140 nm.

The location 114E of the first emitting layer (EML) of the first emission portion is in the range of 30 nm to 60 nm from the first electrode 102. For example, the location 114E of the first emitting layer (EML) may be at 40 nm from the first electrode 102. The location 115E of the second emitting layer (EML) is in the range of 50 nm to 90 nm from the first electrode 102. For example, the location 115E of the second emitting layer (EML) may be at 60 nm from the first electrode 102. The thickness of the first emitting layer (EML) 114 may be in the range of 20 nm to 300 Å, and the thickness of the second emitting layer (EML) 115 may be in the range of 5 nm to 10 nm.

The location 124E of the third emitting layer (EML) of the second emission portion is in the range of 120 nm to 160 nm from the first electrode 102. For example, the location 124E of the third emitting layer (EML) may be at 140 nm from the first electrode 102. The thickness of the third emitting layer (EML) 124 may be in the range of 20 nm to 30 nm.

The results of efficiency, a color coordinate, a DCI area ratio, a DCI coverage, and Δu'v', which are measured in accordance with the first and second embodiments of the present invention, will be described with reference to Table 1.

TABLE 1

| Embodiments | | First Embodiment | Second Embodiment |
|---|---|---|---|
| Efficiency (cd/A) | R | 6.2 | 5.4 |
| | G | 27.0 | 28.6 |
| | B | 2.5 | 2.6 |
| | W | 66.7 | 66.5 |
| | Panel | 24.6 | 21.1 |
| Color coordinate | Wx | 0.314 | 0.302 |
| | Wy | 0.353 | 0.364 |
| DCI area ratio (%) | | 103.2 | 104.8 |
| DCI coverage (%) | | 99.6 | 99.7 |
| Δu'v' | | 0.029 | 0.021 |

In Table 1, referring to efficiency, it is noted that red (R) efficiency of the first embodiment was more improved than red (R) efficiency of the second embodiment as much as 15%. Also, it is noted that the first embodiment is similar to the second embodiment in green (G) efficiency, blue (B) efficiency and white (W) efficiency. It is noted that panel efficiency of the second embodiment was more improved than panel efficiency of the first embodiment as much as 16%. Therefore, it is noted that the second embodiment was more improved than the first embodiment in view of red efficiency and panel efficiency.

Referring to a white color coordinate (Wx, Wy), it is noted that the first embodiment shows (0.314, 0.353) and the second embodiment shows (0.302, 0.364).

Referring to a DCI (Digital Cinema Initiatives) area ratio, it is noted that the first embodiment shows 103.2% and the second embodiment shows 104.8%. Referring to a DCI coverage, it is noted that the first embodiment shows 99.6% and the second embodiment shows 99.7%. As a result, it is noted that the first embodiment and the second embodiment are similar to each other in a color reproduction ratio.

Referring to a Δu'v' based on a viewing angle, it is noted that the first embodiment shows 0.029 and the second embodiment shows 0.021. Since a Δu'v' of the second embodiment is smaller than a Δu'v' of the first embodiment, it is noted that the second embodiment has color shift rate properties more excellent than those of the first embodiment. The Δu'v' based on a viewing angle will be described later in detail with reference to FIG. 10.

Figure 5:
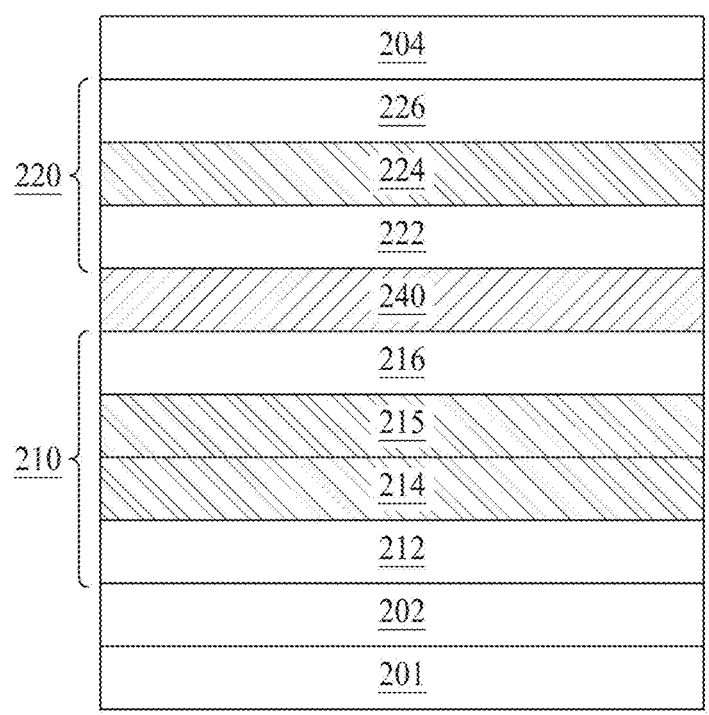
FIG. 5 is a brief cross-sectional diagram illustrating an organic light emitting diode according to a third example embodiment of the present invention.

FIG. 5 is a brief cross-sectional diagram illustrating an organic light emitting diode according to a third example embodiment of the present invention.

The organic light emitting diode 200 shown in FIG. 5 includes first and second electrodes 202 and 204 on a substrate 201, and first and second emission portions 210 and 220 between the first electrode 202 and the second electrode 204.

In the third embodiment of the present invention, the first emission portion includes two emitting layers, and the second emission portion includes a single emitting layer. The two emitting layers in the first emission portion include a green emitting layer and a red emitting layer, and the single emitting layer in the second emission portion includes a deep blue emitting layer.

The first emission portion 210 may include a first hole transporting layer (HTL) 212, a first emitting layer (EML) 214, a second emitting layer (EML) 215, and a first electron transporting layer (ETL) 216.

The first emitting layer (EML) 214 constituting the first emission portion 210 includes a red emitting layer, and the second emitting layer (EML) 215 includes a green emitting layer. The red emitting layer may be closer to the first electrode 202 than the green emitting layer.

The first emitting layer (EML) 214 of the first emission portion 210 includes a red emitting layer to which a red dopant of which maximum wavelength of a PL peak is 620 nm is applied. And, the second emitting layer (EML) 215 includes a green emitting layer to which a green dopant of which maximum wavelength of a PL peak is 532 nm is applied.

The second emission portion 220 may include a second hole transporting layer (HTL) 222, a third emitting layer (EML) 224, and a second electron transporting layer (ETL) 226.

The third emitting layer (EML) 224 of the second emission portion 220 includes a dark blue emitting layer. The third emitting layer (EML) 224 of the second emission portion 220 includes a dark blue emitting layer to which a dark blue dopant of which maximum wavelength of a PL peak is 444 nm is applied.

A charge generating layer (CGL) 240 may further be provided between the first emission portion 210 and the second emission portion 220.

To improve blue efficiency, a triplet energy of the second hole transporting layer (HTL) 222 and the second electron transporting layer (ETL) 226 may be adjusted to be higher than a triplet energy of a host of the dark blue emitting layer which is the third emitting layer (EML) 224 as much as 0.01 eV to 0.4 eV.

Since the other elements of the third embodiment are the same as those of the first embodiment, their description will be omitted.

In the organic light emitting display device that includes the organic light emitting diode according to the third embodiment of the present invention, at least one among gate lines and data lines which define each pixel area, and a power line in parallel extended from any one among the gate lines and the data lines are arranged on a substrate, and a switching thin film transistor connected to the gate and data lines and a driving thin film transistor connected to the switching thin film transistor are arranged in each pixel area. The driving thin film transistor is connected to the first electrode 202.

Figure 6:
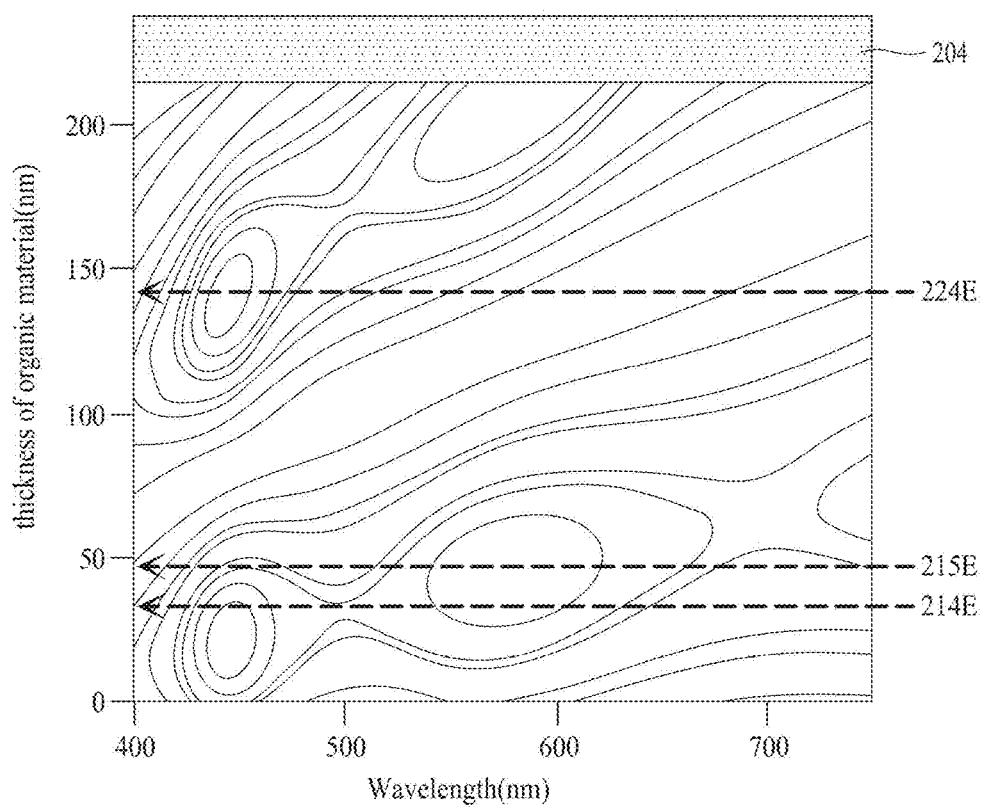
FIG. 6 is a diagram illustrating a contour map according to the third embodiment of the present invention.

FIG. 6 suggests a structure of the present invention through a contour map through optical simulation based on the organic light emitting diode shown in FIG. 5.

FIG. 6 is a diagram illustrating a contour map according to the third embodiment of the present invention.

In FIG. 6, a horizontal axis represents a wavelength, and a vertical axis represents a thickness of an organic material. Although a unit of the thickness of the organic material is nanometer (nm) in FIG. 6. The thickness of the organic material indicates the thickness of the organic layers arranged between the first electrode and the second electrode. The organic layers indicates organic layers constituting the first emission portion 210 and the second emission portion 220 as shown in FIG. 5, and include a hole transporting layer (HTL), an electron transporting layer (ETL), a charge generating layer (CGL), and an emitting layer (EML). If a buffer layer is further provided below the second electrode, the buffer layer is not included in the organic layers.

As shown in FIG. 6, it is noted from the third embodiment of the present invention that the thickness of the organic layers between the first electrode 202 and the second electrode 204 is in the range of 200 nm to 230 nm. For example, the thickness of the organic layers between the first electrode 202 and the second electrode 204 may be adjusted to 215 nm. And, the thickness of the first electrode 202 may be in the range of 10 nm to 15 nm. The thickness of the second electrode 204 may be in the range of 100 nm to 1500 Å, for example, the thickness of the second electrode 204 may be 140 nm.

The location 214E of the first emitting layer (EML) of the first emission portion is in the range of 20 nm to 50 nm from the first electrode 202. For example, the location 214E of the first emitting layer (EML) may be at 30 nm from the first electrode 202. The location 215E of the second emitting layer (EML) is in the range of 25 nm to 60 nm from the first electrode 202. For example, the location 215E of the second emitting layer (EML) may be at 50 nm from the first electrode 202. The thickness of the first emitting layer (EML) 214 may be in the range of 5 nm to 100 Å, and the thickness of the second emitting layer (EML) 215 may be in the range of 20 nm to 30 nm.

The location 224E of the third emitting layer (EML) of the second emission portion is in the range of 120 nm to 160 nm from the first electrode 202. For example, the location 224E of the third emitting layer (EML) may be at 140 nm from the first electrode 202. The thickness of the third emitting layer (EML) 224 may be in the range of 20 nm to 30 nm.

The results of efficiency, a color coordinate, a DCI area ratio, a DCI coverage, and a Δu'v', which are measured in accordance with the third embodiment of the present invention, will be described with reference to Table 2.

TABLE 2

| Embodiment | | Third Embodiment |
|---|---|---|
| Efficiency (cd/A) | R | 5.5 |
| | G | 26.9 |
| | B | 2.5 |
| | W | 65.4 |
| | Panel | 22.8 |
| Color coordinate | Wx | 0.306 |
| | Wy | 0.353 |
| DCI area ratio (%) | | 102.3 |
| DCI coverage (%) | | 99.4 |
| Δu'v' | | 0.030 |

Although Table 2 shows the results of the third embodiment, the results of the third embodiment will be described as compared with Table 1 corresponding to the results of the first embodiment. That is, because the first emitting layer and the second emitting layer, which are included in the first emission portion, are provided differently from each other in the first and the third embodiments, the results of the third embodiment will be described as compared with the results of the first embodiment.

Referring to efficiency, it is noted that red (R) efficiency of the third embodiment was reduced as much as 13% as compared with red (R) efficiency of the first embodiment. Also, it is noted that the first embodiment is similar to the third embodiment in green (G) efficiency, blue (B) efficiency and white (W) efficiency. It is noted that panel efficiency of the third embodiment was reduced as much as 8% as compared with panel efficiency of the first embodiment. Therefore, it is noted that red efficiency and panel efficiency of the third embodiment was reduced as compared with those of the first embodiment.

Referring to a white color coordinate (Wx, Wy), it is noted that the third embodiment shows (0.306, 0.353).

Referring to a DCI (Digital Cinema Initiatives) area ratio, it is noted that the third embodiment shows 102.3% similar to that of the first second embodiment. Referring to a DCI coverage, it is noted that the third embodiment shows 99.4% similar to that of the first embodiment. As a result, it is noted that the first embodiment and the third embodiment are similar to each other in a color reproduction ratio.

Referring to Δu'v' based on a viewing angle, it is noted that the third embodiment shows 0.030 similar to that of the first embodiment. The Δu'v' based on a viewing angle will be described later in detail with reference to FIG. 10.

Figure 7:
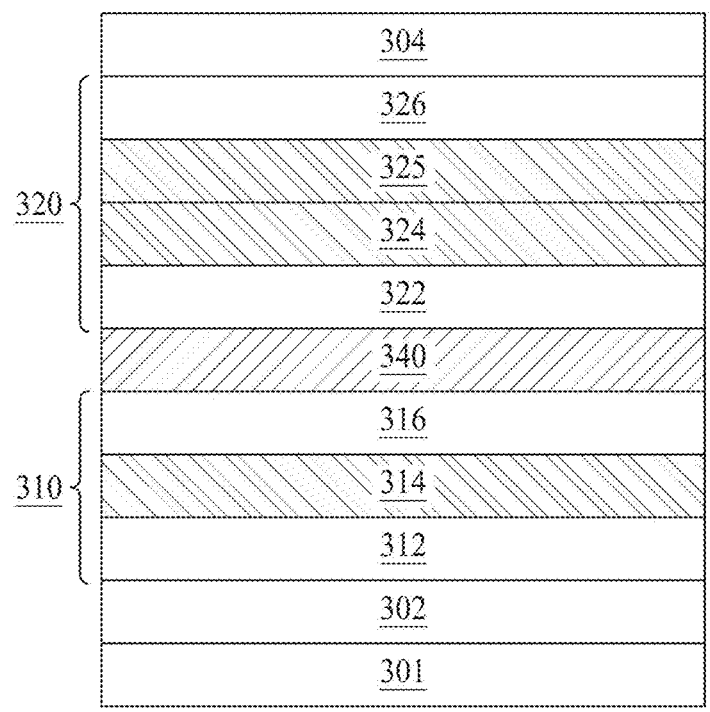
FIG. 7 is a brief cross-sectional diagram illustrating an organic light emitting diode according to a fourth example embodiment of the present invention.

FIG. 7 is a brief cross-sectional diagram illustrating an organic light emitting diode according to a fourth example embodiment of the present invention.

The organic light emitting diode 300 shown in FIG. 7 includes first and second electrodes 302 and 304 on a substrate 301, and first and second emission portions 310 and 320 between the first electrode 302 and the second electrode 304.

In the fourth embodiment of the present invention, the first emission portion includes a single emitting layer, and the second emission portion includes two emitting layers. The single emitting layer in the first emission portion includes a blue emitting layer, and the two emitting layers in the second emission portion include a green emitting layer and a blue emitting layer.

The first emission portion 310 may include a first hole transporting layer (HTL) 312, a first emitting layer (EML) 314, and a first electron transporting layer (ETL) 316.

The first emitting layer (EML) 314 constituting the first emission portion 310 includes a dark blue emitting layer to which a dark blue dopant of which maximum wavelength of a PL peak is 444 nm is applied.

The second emission portion 320 may include a second hole transporting layer (HTL) 322, a second emitting layer (EML) 324, a third emitting layer (EML) 325, and a second electron transporting layer (ETL) 326.

The second emitting layer (EML) 324 of the second emission portion 320 includes a green emitting layer to which a green dopant of which maximum wavelength of a PL peak is 532 nm is applied. Also, the third emitting layer (EML) 325 includes a red emitting layer to which a red dopant of which maximum wavelength of a PL peak is 620 nm is applied.

The red emitting layer may be comprised to be closer to the second electrode 304 than the green emitting layer.

A charge generating layer (CGL) 340 may further be provided between the first emission portion 310 and the second emission portion 320.

To improve blue efficiency, a triplet energy of the first hole transporting layer (HTL) 312 and the first electron transporting layer (ETL) 316 may be adjusted to be higher than a triplet energy of a host of the dark blue emitting layer which is the first emitting layer (EML) 314 as much as 0.01 eV to 0.4 eV.

Since the other elements of the fourth embodiment are the same as those of the first embodiment, their description will be omitted.

In the organic light emitting display device that includes the organic light emitting diode according to the fourth embodiment of the present invention, at least among gate lines and data lines which define each pixel area, and a power line in parallel extended from any one among the gate lines and the data lines are arranged on a substrate, and a switching thin film transistor connected to the gate and data lines and a driving thin film transistor connected to the switching thin film transistor are arranged in each pixel area. The driving thin film transistor is connected to the first electrode 302.

Figure 8:
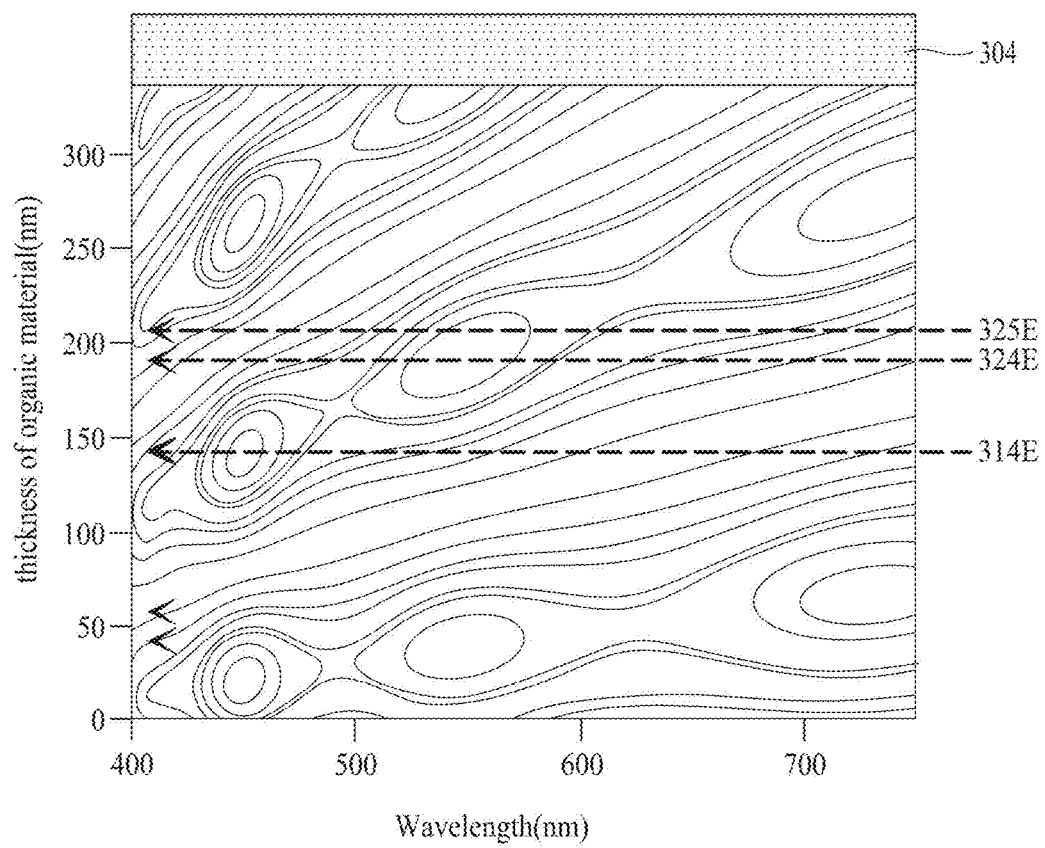
FIG. 8 is a diagram illustrating a contour map according to the fourth embodiment of the present invention.

FIG. 8 suggests a structure of the present invention through a contour map through optical simulation based on the organic light emitting diode shown in FIG. 7.

FIG. 8 is a diagram illustrating a contour map according to the fourth embodiment of the present invention.

In FIG. 8, a horizontal axis represents a wavelength, and a vertical axis represents a thickness of an organic material. Although a unit of the thickness of the organic material is nanometer (nm) in FIG. 8. The thickness of the organic material indicates the thickness of the organic layers arranged between the first electrode and the second electrode. The organic layers indicates organic layers constituting the first emission portion 310 and the second emission portion 320 as shown in FIG. 7, and include a hole transporting layer (HTL), an electron transporting layer (ETL), a charge generating layer (CGL), and an emitting layer (EML). If a buffer layer is further provided below the second electrode, the buffer layer is not included in the organic layers.

As shown in FIG. 8, it is noted from the fourth embodiment of the present invention that the thickness of the organic layers between the first electrode 302 and the second electrode 304 is in the range of 320 nm to 350 nm. For example, the thickness of the organic layers arranged between the first electrode 302 and the second electrode 304 may be set to 340 nm. And, the thickness of the first electrode 302 may be in the range of 10 nm to 15 nm. The thickness of the second electrode 304 may be in the range of 100 nm to 1500 Å, for example, the thickness of the second electrode 304 may be 140 nm.

The location 314E of the first emitting layer (EML) of the first emission portion is in the range of 120 nm to 160 nm from the first electrode 302. For example, the location 314E of the first emitting layer (EML) may be at 140 nm from the first electrode 302. The thickness of the first emitting layer (EML) 314 may be in the range of 20 nm to 30 nm.

The location 324E of the second emitting layer (EML) of the second emission portion is in the range of 170 nm to 200 nm from the first electrode 302. For example, the location 324E of the second emitting layer (EML) may be at 190 nm from the first electrode 302. The location 325E of the third emitting layer (EML) is in the range of 200 nm to 230 nm from the first electrode 302. For example, the location 325E of the third emitting layer (EML) may be at 210 nm from the first electrode 302. The thickness of the second emitting layer (EML) 324 may be in the range of 20 nm to 300 Å, and the thickness of the third emitting layer (EML) 325 may be in the range of 5 nm to 10 nm.

The results of efficiency, a color coordinate, a DCI area ratio, a DCI coverage, and a Δu'v', which are measured in accordance with the fourth embodiment of the present invention, will be described with reference to Table 3.

TABLE 3

| Embodiment | | Fourth Embodiment |
|---|---|---|
| Efficiency (cd/A) | R | 4.3 |
| | G | 27.8 |
| | B | 2.5 |
| | W | 63.0 |
| | Panel | 18.1 |
| Color coordinate | Wx | 0.290 |
| | Wy | 0.361 |
| DCI area ratio (%) | | 103.7 |
| DCI coverage (%) | | 99.6 |
| Δu'v' | | 0.028 |

Although Table 3 shows the results of the fourth embodiment, the results of the fourth embodiment will be described as compared with Table 1 corresponding to the results of the first embodiment. That is, because the first emitting layer and the second emitting layer, which are included in the first emission portion, are provided differently from each other in the first and the fourth embodiments, the results of the fourth embodiment will be described as compared with the results of the first embodiment.

Referring to efficiency, it is noted that red (R) efficiency of the fourth embodiment was reduced as much as 30% as compared with red (R) efficiency of the first embodiment. Also, it is noted that the first embodiment is similar to the fourth embodiment in green (G) efficiency, blue (B) efficiency and white (W) efficiency. It is noted that panel efficiency of the fourth embodiment was reduced as much as 6% as compared with panel efficiency of the first embodiment. Therefore, it is noted that red efficiency and panel efficiency of the fourth embodiment was reduced as compared with those of the first embodiment.

Referring to a white color coordinate (Wx, Wy), it is noted that the fourth embodiment shows (0.290, 0.361).

Referring to a DCI (Digital Cinema Initiatives) area ratio, it is noted that the fourth embodiment shows 103.7% similar to that of the first embodiment. Referring to a DCI coverage, it is noted that the fourth embodiment shows 99.6% similar to that of the first embodiment. As a result, it is noted that the first embodiment and the fourth embodiment are similar to each other in a color reproduction ratio.

Referring to a Δu'v' based on a viewing angle, it is noted that the fourth embodiment shows 0.028 similar to that of the first embodiment. The Δu'v' based on a viewing angle will be described later in detail with reference to FIG. 10.

Figure 9:
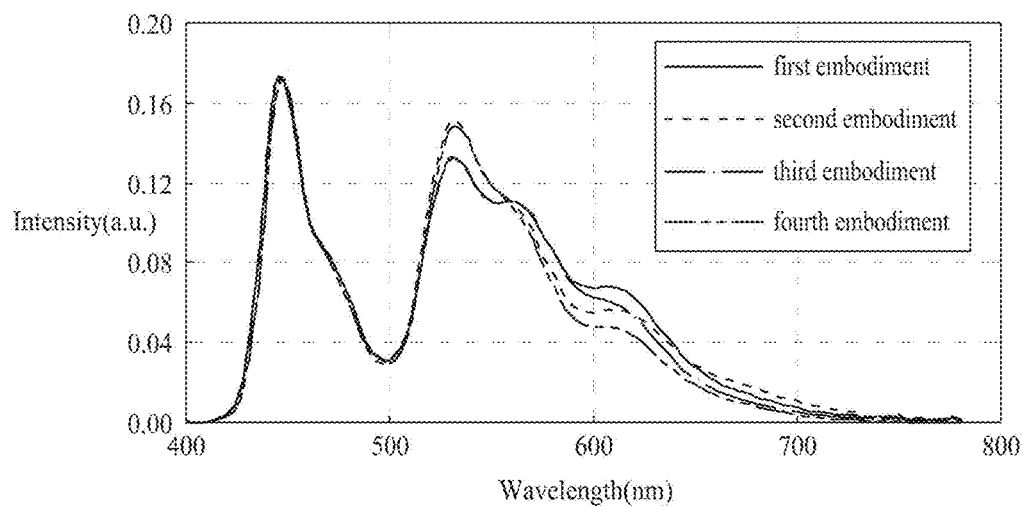
FIG. 9 is a diagram illustrating EL spectrum according to the first to fourth embodiments of the present invention.

FIG. 9 is a diagram illustrating EL spectrum of an organic light emitting display device according to the first to fourth embodiments of the present invention. In FIG. 9, a horizontal axis represents a wavelength (nm) of light, and a vertical axis represents electroluminescence intensity. Electroluminescence intensity (a.u., arbitrary unit) is a numeric value expressed as a relative value based on a maximum value of EL spectrum. For example, as shown in FIG. 6, the electroluminescence intensity in the blue area having a range of 440 nm to 480 nm may be 0.30 (au.) and the electroluminescence intensity in the yellow-green area having a range of 540 nm to 580 nm may be 0.18 (a.u.) by conversion based on 0.30 (a.u.) which is a maximum value of the EL spectrum. That is, 0.18 (a.u.) is expressed as a relative value based on 0.30 (a.u.) which is the maximum value of the EL spectrum. Also, the electroluminescence intensity in the yellow-green area is expressed based on the electroluminescence intensity in the blue area which is the maximum value of EL spectrum.

Also, in FIG. 9, since the first, second, third and fourth embodiments of the present invention are the same as those described above, their description will be omitted. The EL spectrum according to the first embodiment of the present invention is marked with a solid line, the EL spectrum according to the second embodiment is marked with a dotted line, the EL spectrum according to the third embodiment is marked with an alternate long and short dash line, and the EL spectrum according to the fourth embodiment is marked with an alternate long and two short dashes line.

As shown in FIG. 9, it is noted from the first to fourth embodiments of the present invention that three EL peaks are generated in the EL spectrum. That is, the first peak corresponds to a blue area, and a wavelength corresponding to the blue area may be in the range of 440 nm to 480 nm. The second peak corresponds to a green area, and a wavelength corresponding to the green area may be in the range of 530 nm to 580 nm. The third peak corresponds to a red area, and a wavelength corresponding to the red area may be in the range of 600 nm to 650 nm. Therefore, it is noted that three EL peaks may have wavelengths in the range of 440 nm to 480 nm, 530 nm to 580 nm, and 600 nm to 650 nm, respectively.

In the wavelength area of the first peak, it is noted that EL intensity of the first embodiment is similar to EL intensity of each of the second to fourth embodiments. In the wavelength area of the second peak, it is noted that EL intensity of each of the second and fourth embodiments was improved as compared with each of the first and third embodiments. Therefore, it is noted that green efficiency of the second and fourth embodiments was improved as compared with the first and third embodiments. In the wavelength area of the third peak, it is noted that red efficiency of the first embodiment was improved as compared with the second to fourth embodiments.

Figure 10:
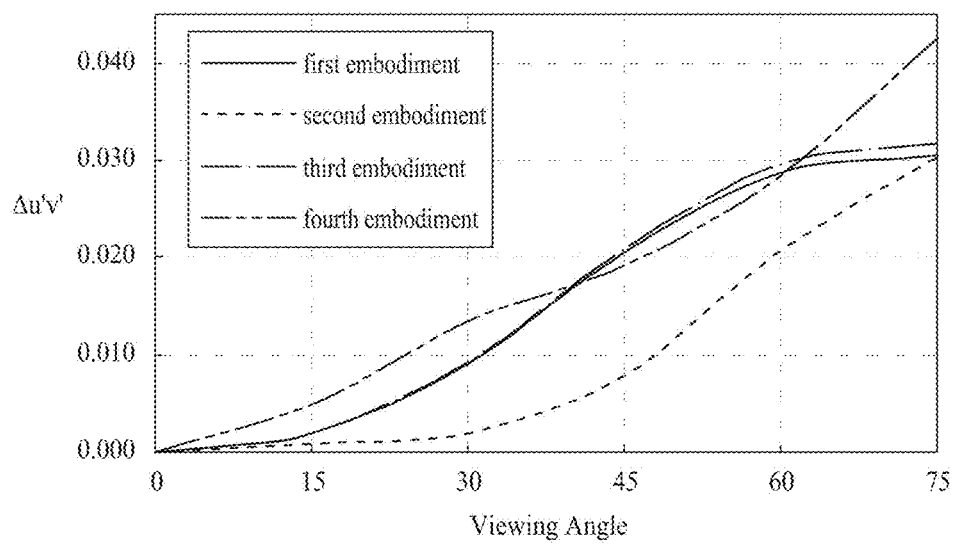
FIG. 10 is a diagram illustrating a color shift rate based on a viewing angle according to the first to fourth embodiments of the present invention.

FIG. 10 is a diagram illustrating a Δu'v' based on a viewing angle of the organic light emitting display device according to the first to fourth embodiments of the present invention. In FIG. 10, a horizontal axis represents viewing angles, and a vertical axis represents a Δu'v'.

In FIG. 10, Δu'v' is measured by tilting at 0°, 15°, 30°, 45° and 60° from the front of the organic light emitting display device. The Δu'v' in a specific viewing angle denotes a difference between the color shift rate in the viewing angle 0° and the color shift rate in the specific viewing angle. For example, the Δu'v' in the viewing angle 60° denotes a difference between the color shift rate in the viewing angle 0° and the color shift rate of the viewing angle 60°. The viewing angle 60° may be an angle in a side direction of the organic light emitting display device. And the Δu'v' is measured by CIE 1976 UCS diagram (u' v' coordinate system).

Also, in FIG. 10, since the first, second, third and fourth embodiments are the same as those described above, their description will be omitted. The variance according to the first embodiment of the present invention is marked with a solid line, the variance according to the second embodiment is marked with a dotted line, the variance according to the third embodiment is marked with an alternate long and short dash line, and the variance according to the fourth embodiment is marked with an alternate long and two short dashes line.

As shown in FIG. 10, it is noted that the Δu'v' in the second embodiment is lower than that in each of the first, third and fourth embodiments in a viewing angle direction of 0° to 60° corresponding to the front side of the organic light emitting display device. As a result, it is noted that the color shift rate property in the second embodiment is more excellent than that in each of the first, third and fourth embodiments.

Figure 11:
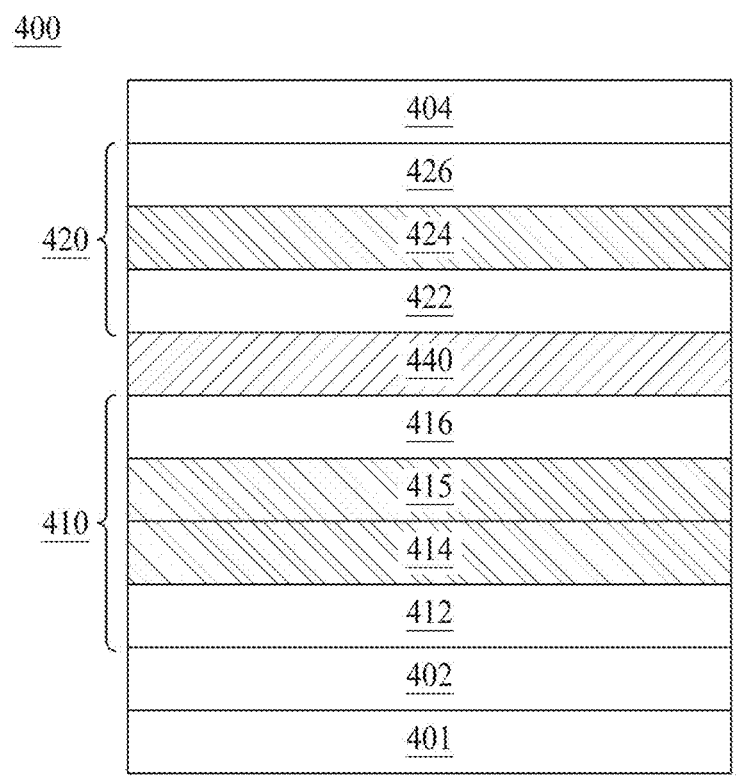
FIG. 11 is a brief cross-sectional diagram illustrating an organic light emitting diode according to fifth and sixth example embodiments of the present invention.

FIG. 11 is a brief cross-sectional diagram illustrating an organic light emitting diode according to fifth and sixth example embodiments of the present invention.

The organic light emitting diode 400 shown in FIG. 11 includes first and second electrodes 402 and 404 on a substrate 401, and first and second emission portions 410 and 420 between the first electrode 402 and the second electrode 404.

In the fifth and sixth embodiments of the present invention, the first emission portion includes two emitting layers, and the second emission portion includes a single emitting layer. The two emitting layers in the first emission portion include a yellow-green emitting layer and a red emitting layer, and the single emitting layer in the second emission portion includes a blue emitting layer.

The first emission portion 410 may include a first hole transporting layer (HTL) 412, a first emitting layer (EML) 414, a second emitting layer (EML) 415, and a first electron transporting layer (ETL) 416.

The first emitting layer (EML) 414 constituting the first emission portion 410 includes a yellow-green emitting layer to which a yellow-green dopant of which maximum wavelength of a PL peak is 556 nm is applied. The second emitting layer (EML) 415 includes a red emitting layer to which a red dopant of which maximum wavelength of a PL peak is 620 nm is applied. The yellow-green emitting layer may be closer to the first electrode 402 than the red emitting layer.

The second emission portion 420 may include a second hole transporting layer (HTL) 422, a third emitting layer (EML) 424, and a second electron transporting layer (ETL) 426.

The third emitting layer (EML) 424 of the second emission portion 420 includes a blue emitting layer to which a blue dopant of which maximum wavelength of a PL peak is 456 nm is applied.

The fifth and sixth embodiments of the present invention may apply yellow-green emitting layer instead of the green emitting layer, whereby lifetime of the organic light emitting display device may be improved.

Also, a charge generating layer (CGL) 440 may further be provided between the first emission portion 410 and the second emission portion 420.

To improve blue efficiency, a triplet energy of the second hole transporting layer (HTL) 422 and the second electron transporting layer (ETL) 426 may be adjusted to be higher than a triplet energy of a host of the blue emitting layer which is the third emitting layer (EML) 424 as much as 0.01 eV to 0.4 eV.

Since the other elements of the fourth embodiment are the same as those of the first embodiment, their description will be omitted.

In the organic light emitting display device that includes the organic light emitting diode according to the fifth and sixth embodiments of the present invention, at least one among gate lines and data lines which define each pixel area, and a power line in parallel extended from any one among the gate lines and the data lines are arranged on a substrate, and a switching thin film transistor connected to the gate and data lines and a driving thin film transistor connected to the switching thin film transistor are arranged in each pixel area. The driving thin film transistor is connected to the first electrode 402.

The structure of the present invention is suggested through a contour map through optical simulation based on the organic light emitting diode shown in FIG. 11.

Figure 12:
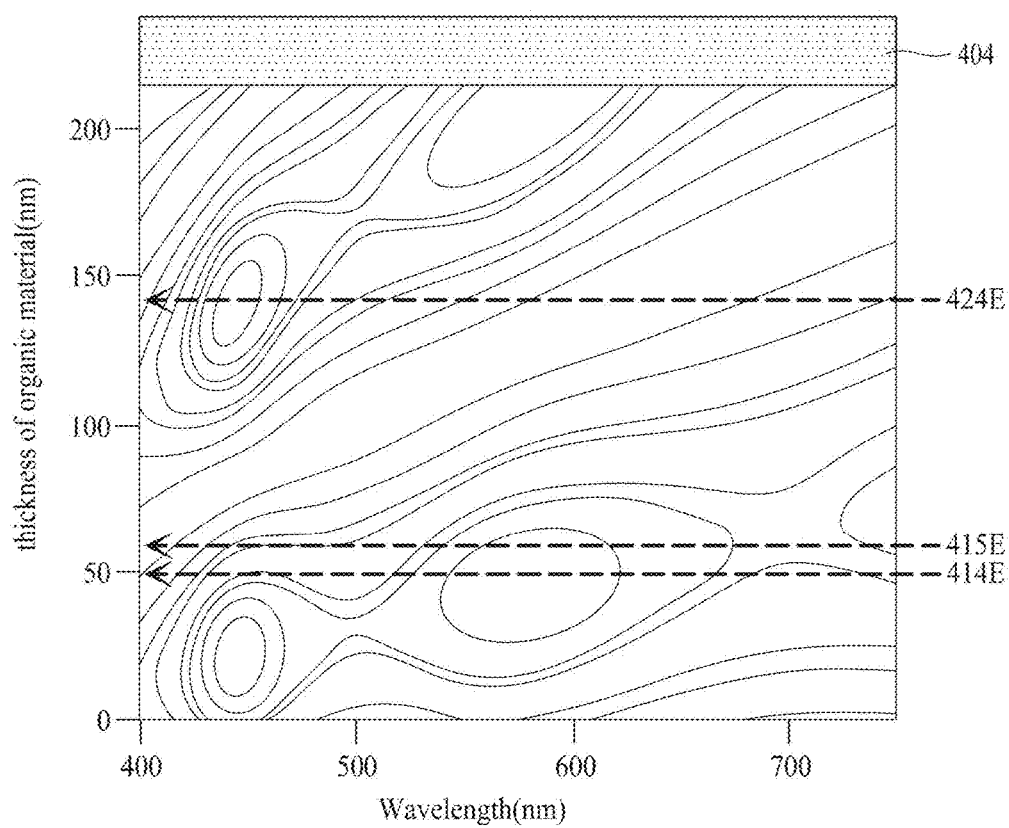
FIG. 12 is a diagram illustrating a contour map according to the fifth embodiment of the present invention.
Figure 13:
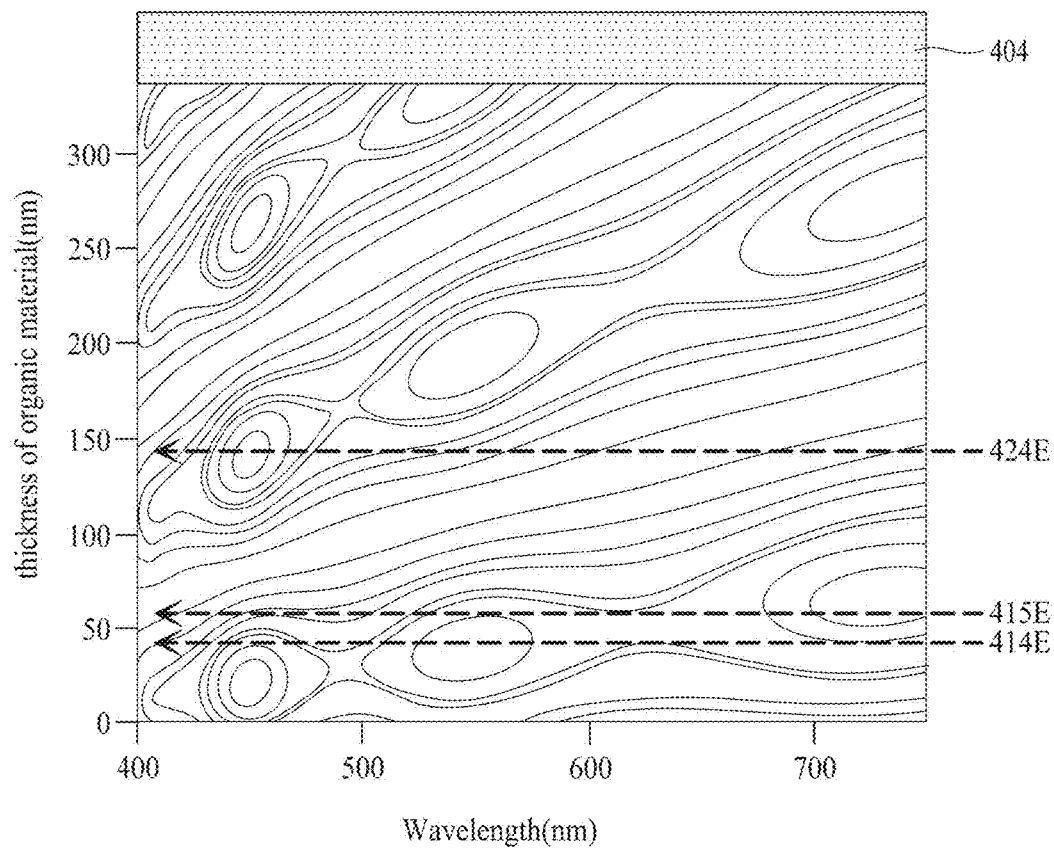
FIG. 13 is a diagram illustrating a contour map according to the sixth embodiment of the present invention.

FIG. 12 is a diagram illustrating a contour map according to the fifth embodiment of the present invention, and FIG. 13 is a diagram illustrating a contour map according to the sixth embodiment of the present invention.

In FIGS. 12 and 13, a horizontal axis represents a wavelength, and a vertical axis represents a thickness of an organic material. Although a unit of the thickness of the organic material is nanometer (nm) in FIGS. 12 and 13. The thickness of the organic material indicates the thickness of the organic layers arranged between the first electrode and the second electrode. The organic layers indicates organic layers constituting the first emission portion 410 and the second emission portion 420 as shown in FIG. 11, and include a hole transporting layer (HTL), an electron transporting layer (ETL), a charge generating layer (CGL), and an emitting layer (EML). If a buffer layer is further provided below the second electrode, the buffer layer is not included in the organic layers.

The organic light emitting diode shown in FIG. 11 is applied to the fifth embodiment of the present invention, and the thickness of the organic layers arranged between the first electrode and the second electrode is in the range of 200 nm to 240 nm. The organic light emitting diode shown in FIG. 11 is applied to the sixth embodiment of the present invention, and the thickness of the organic layers arranged between the first electrode and the second electrode is in the range of 340 nm to 370 nm.

As shown in FIG. 12, it is noted from the fifth embodiment of the present invention that the thickness of the organic layers between the first electrode and the second electrode is in the range of 200 nm to 240 nm. For example, the thickness of the organic layers between the first electrode and the second electrode may be adjusted to 225 nm. And, the thickness of the first electrode 402 may be in the range of 10 nm to 15 nm. The thickness of the second electrode 404 may be in the range of 100 nm to 1500 Å, for example, the thickness of the second electrode 404 may be 140 nm.

The location 414E of the first emitting layer (EML) of the first emission portion is in the range of 30 nm to 60 nm from the first electrode 402. For example, the location 414E of the first emitting layer (EML) may be at 50 nm from the first electrode 402. The location 415E of the second emitting layer (EML) is in the range of 50 nm to 90 nm from the first electrode 402. For example, the location 415E of the second emitting layer (EML) may be at 60 nm from the first electrode 402. The thickness of the first emitting layer (EML) 414 may be in the range of 20 nm to 300 Å, and the thickness of the second emitting layer (EML) 415 may be in the range of 5 nm to 10 nm.

The location 424E of the third emitting layer (EML) of the second emission portion is in the range of 120 nm to 160 nm from the first electrode 402. For example, the location 424E of the third emitting layer (EML) may be at 140 nm from the first electrode 402. The thickness of the third emitting layer (EML) 424 may be in the range of 20 nm to 30 nm.

As shown in FIG. 13, it is noted from the sixth embodiment of the present invention that the thickness of the organic layers arranged between the first electrode 402 and the second electrode 404 is in the range of 340 nm to 370 nm. For example, the thickness of the organic layers between the first electrode 402 and the second electrode 404 may be adjusted to 360 nm. And, the thickness of the first electrode 402 may be in the range of 10 nm to 15 nm.

The thickness of the second electrode 404 may be in the range of 100 nm to 1500 Å, for example, the thickness of the second electrode 404 may be 140 nm.

The location 414E of the first emitting layer (EML) of the first emission portion is in the range of 30 nm to 60 nm from the first electrode 402. For example, the location 414E of the first emitting layer (EML) may be at 40 nm from the first electrode 402. The location 415E of the second emitting layer (EML) is in the range of 50 nm to 90 nm from the first electrode 402. For example, the location 415E of the second emitting layer (EML) may be at 60 nm from the first electrode 402. The thickness of the first emitting layer (EML) 414 may be in the range of 20 nm to 300 Å, and the thickness of the second emitting layer (EML) 415 may be in the range of 5 nm to 10 nm.

The location 424E of the third emitting layer (EML) of the second emission portion is in the range of 120 nm to 160 nm from the first electrode 402. For example, the location 424E of the third emitting layer (EML) may be at 140 nm from the first electrode 402. The thickness of the third emitting layer (EML) 424 may be in the range of 20 nm to 30 nm.

The results of efficiency, a color coordinate, a DCI area ratio, a DCI coverage, and a Δu'v', which are measured in accordance with the fifth and sixth embodiments of the present invention, will be described with reference to Table 4.

TABLE 4

| Embodiments | | Fifth Embodiment | Sixth Embodiment |
|---|---|---|---|
| Efficiency (cd/A) | R | 8.1 | 6.6 |
| | G | 21.0 | 19.0 |
| | B | 2.8 | 2.6 |
| | W | 63.1 | 57.1 |
| | Panel | 22.4 | 20.3 |
| Color coordinate | Wx | 0.336 | 0.333 |
| | Wy | 0.325 | 0.328 |
| DCI area ratio (%) | | 97.3 | 94.7 |
| DCI coverage (%) | | 96.4 | 93.7 |
| Δu'v' | | 0.033 | 0.029 |

In Table 4, referring to efficiency, it is noted that red (R) efficiency of the fifth embodiment was more improved than red (R) efficiency of the sixth embodiment as much as 20% and green (G) efficiency of the fifth embodiment was more improved than green (G) efficiency of the sixth embodiment as much as 10%. Also, it is noted that blue (B) efficiency of the fifth embodiment was more improved than blue (B) efficiency of the sixth embodiment as much as 8% and white (W) efficiency of the fifth embodiment was more improved than white (W) efficiency of the sixth embodiment as much as 10%. It is noted that panel efficiency of the fifth embodiment was more improved than panel efficiency of the sixth embodiment as much as 10%. Therefore, it is noted that the fifth embodiment was more improved than the sixth embodiment in view of red efficiency, green efficiency, blue efficiency, white efficiency and panel efficiency.

Referring to a white color coordinate (Wx, Wy), it is noted that the fifth embodiment shows (0.336, 0.325) and the sixth embodiment shows (0.333, 0.328).

Referring to a DCI (Digital Cinema Initiatives) area ratio, it is noted that the fifth embodiment shows 97.3% and the sixth embodiment shows 94.7%. Referring to a DCI coverage, it is noted that the fifth embodiment shows 96.4% and the sixth embodiment shows 93.7%. As a result, it is noted that a color reproduction ratio of the fifth embodiment is more excellent than that of the sixth embodiment.

Referring to a Δu'v' based on a viewing angle, it is noted that the fifth embodiment shows 0.033 and the sixth embodiment shows 0.029. Since the Δu'v' of the sixth embodiment is smaller than Δu'v' of the fifth embodiment, it is noted that the sixth embodiment has color shift rate properties more excellent than color shift rate properties of the fifth embodiment. The Δu'v' based on a viewing angle will be described later in detail with reference to FIG. 15.

Figure 14:
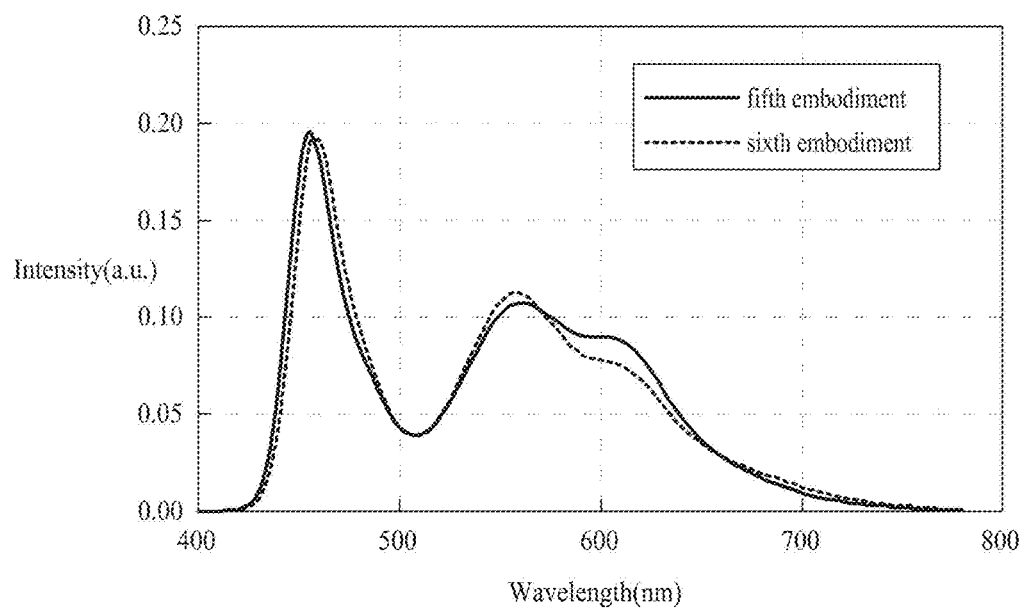
FIG. 14 is a diagram illustrating EL spectrum according to the fifth and sixth embodiments of the present invention.

FIG. 14 is a diagram illustrating EL spectrum of an organic light emitting display device according to the fifth and sixth embodiments of the present invention. In FIG. 14, a horizontal axis represents a wavelength of light, and a vertical axis represents electroluminescence intensity. Electroluminescence intensity is a numeric value expressed as a relative value based on a maximum value of EL spectrum.

Also, in FIG. 14, since the fifth and sixth embodiments are the same as those described above, their description will be omitted. The EL spectrum according to the fifth embodiment of the present invention is marked with a solid line, and the EL spectrum according to the sixth embodiment is marked with a dotted line.

As shown in FIG. 14, it is noted from the fifth and sixth embodiments of the present invention that three EL peaks are generated in the EL spectrum. That is, the first peak corresponds to a blue area, and a wavelength corresponding to the blue area may be in the range of 440 nm to 480 nm. The second peak corresponds to a green area, and a wavelength corresponding to the green area may be in the range of 530 nm to 580 nm. The third peak corresponds to a red area, and a wavelength corresponding to the red area may be in the range of 600 nm to 650 nm. Therefore, it is noted that three EL peaks may have wavelengths in the range of 440 nm to 480 nm, 530 nm to 580 nm, and 600 nm to 650 nm, respectively.

In the wavelength area of the first peak, it is noted that EL intensity of the fifth embodiment is similar to EL intensity of the sixth embodiment. In the wavelength area of the second peak, it is noted that EL intensity of the fifth embodiment was improved as compared with EL intensity of the sixth embodiment. Therefore, it is noted that green efficiency of the fifth embodiment was improved as compared with the sixth embodiment. In the wavelength area of the third peak, it is noted that red efficiency of the fifth embodiment was improved as compared with the sixth embodiment.

Figure 15:
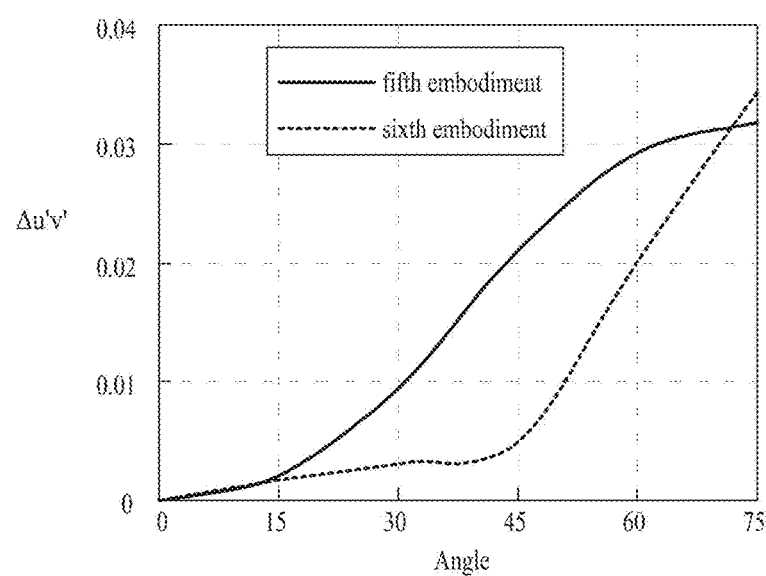
FIG. 15 is a diagram illustrating a color shift rate based on a viewing angle according to the fifth and sixth embodiments of the present invention.

FIG. 15 is a diagram illustrating a Δu'v' based on a viewing angle of the organic light emitting display device according to the fifth and sixth embodiments of the present invention. In FIG. 15, a horizontal axis represents viewing angles, and a vertical axis represents a Δu'v'.

In FIG. 15, the Δu'v' is measured by tilting at 0°, 15°, 30°, 45° and 60° from the front of the organic light emitting display device.

Also, in FIG. 15, since the fifth and sixth embodiments are the same as those described above, their description will be omitted. The variance according to the fifth embodiment is marked with a solid line, and the variance according to the sixth embodiment is marked with a dotted line.

As shown in FIG. 15, it is noted that the Δu'v' in the sixth embodiment is lower than that in the fifth embodiment in a viewing angle direction of 0° to 60° corresponding to the front side of the organic light emitting display device. As a result, it is noted that the color shift rate property in the sixth embodiment is more excellent than that in the fifth embodiment.

It is noted that the organic light emitting display device based on the top emission type according to the first to sixth embodiments has an aperture ratio more improved as much as 40% or more than that of the organic light emitting display device based on the bottom emission type. Also, since the polarizer is not required, luminance of the organic light emitting display device may be improved. Therefore, the organic light emitting display device having an improved aperture ratio, improved luminance, improved efficiency, and an improved color reproduction ratio may be provided.

The organic light emitting diode according to the present invention described as above may be applied to a lighting device, may be used as a thin light source of an LCD device, or may be applied to a display device. Hereinafter, the embodiment of the organic light emitting diode according to the present invention, which is applied to the display device, will be described.

Figure 16:
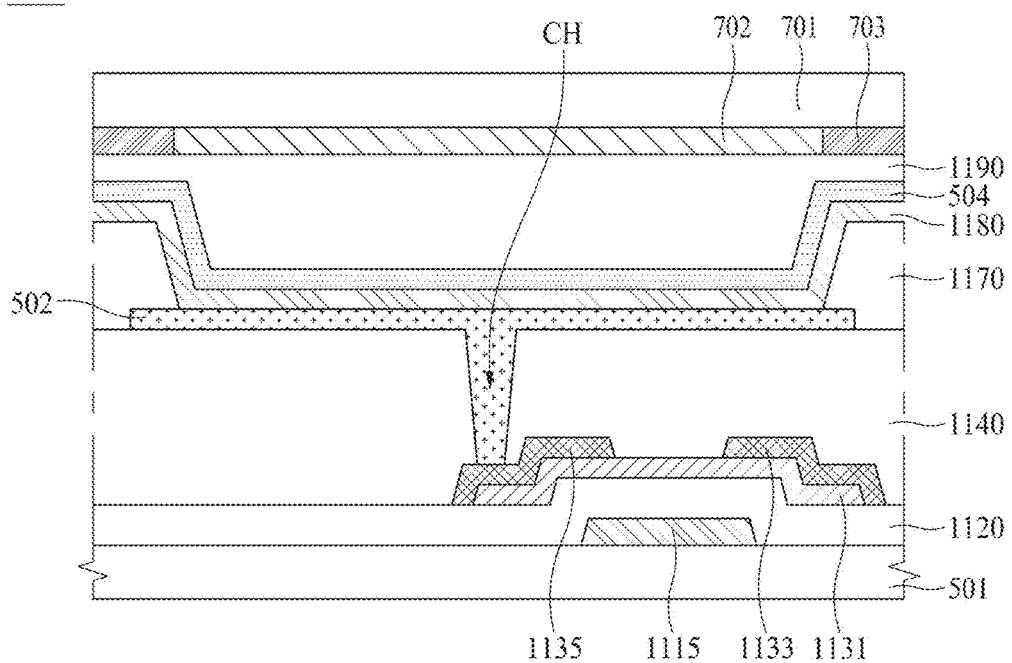
FIG. 16 is a cross-sectional diagram illustrating an organic light emitting display device according to an example embodiment of the present invention.

FIG. 16 is a cross-sectional diagram illustrating an organic light emitting display device, which includes an organic light emitting diode according to an example embodiment of the present invention, wherein the organic light emitting display device is based on the aforementioned organic light emitting diode according to the first to sixth embodiments of the present invention.

As shown in FIG. 16, the organic light emitting display device 1000 of the present invention includes a substrate 501, a thin film transistor TFT, a first electrode 502, an emission portion 1180, and a second electrode 502. The thin film transistor TFT includes a gate electrode 1115, a gate insulating layer 1120, a semiconductor layer 1131, a source electrode 1133, and a drain electrode 1135.

Although the thin film transistor TFT is shown in an inverted staggered structure, the thin film transistor TFT may be formed in a coplanar structure.

The substrate 501 may be formed of glass, metal or plastic.

The gate electrode 1115 is formed on the substrate 501, and is connected with a gate line (not shown). The gate electrode 1115 may be a multi-layer of any one among Mo, Al, Cr, Au, Ti, Ni, Nd, and Cu, or their alloy.

The gate insulating layer 1120 is formed on the gate electrode 1115, and may be, but is not limited to, a silicon oxide (SiOx) film, a silicon nitride (SiNx) film or a multi-layer of SiOx and SiNx.

The semiconductor layer 1131 is formed on the gate insulating layer 1120, and may be formed of amorphous silicon (a-Si), polycrystalline silicon (poly-Si), oxide semiconductor or organic semiconductor. If the semiconductor layer 1131 is formed of an oxide semiconductor, the semiconductor layer 1131 may be formed of, but is not limited to, ITO (Indium Tin Oxide), IZO (Indium Zinc Oxide), or ITZO (Indium Tin Zinc Oxide). Although an etch stopper (not shown) may be formed on the semiconductor layer 1131 to protect the semiconductor layer 1131, the etch stopper may be omitted depending on the structure of the thin film transistor (TFT).

The source electrode 1133 and the drain electrode 1135 may be formed on the semiconductor layer 1131. The source electrode 1133 and the drain electrode 1135 may include a single layer or multi-layer comprised of any one among Mo, Al, Cr, Au, Ti, Ni, Nd and Cu and their alloy.

A passivation layer 1140 is formed on the source electrode 1133 and the drain electrode 1135, and may be formed of a silicon oxide (SiOx) film, a silicon nitride (SiNx) film, or a multi-layer of SiOx and SiNx. Alternatively, the passivation layer 1140 may be formed of, but is not limited to, acrylic resin or polyimide resin.

The first electrode 502 is formed on the passivation layer 1140, and may be formed of, but is not limited to, Au, Ag, Al, Mo, Mg or the like, or their alloy. Alternatively, the first electrode 502 may be formed of, but is not limited to, ITO (indium tin oxide), IZO (indium zinc oxide), or the like. A reflective electrode is additionally provided below the first electrode 502 to reflect light toward the second electrode 504.

The first electrode 502 is electrically connected with the drain electrode 1135 through a contact hole CH of a predetermined area of the passivation layer 1140. Although the drain electrode 1135 and the first electrode 502 are electrically connected with each other in FIG. 16, the source electrode 1133 and the first electrode 502 may electrically be connected with each other through the contact hole CH of the predetermined area of the passivation layer 1140.

A bank layer 1170 is formed on the first electrode 502, and defines a pixel area. That is, the bank layer 1170 is formed in a boundary area between a plurality of pixels in a matrix arrangement, whereby the pixel area is defined by the bank layer 1170. The bank layer 1170 may be formed of an organic material such as benzocyclobutene (BCB) based resin, acrylic resin or polyimide resin. Alternatively, the bank layer 1170 may be formed of a photoresist that includes a black pigment. In this case, the bank layer 1170 serves as a light shielding member.

The emission portion 1180 is formed on the bank layer 1170. The emission portion 1180 includes a first emission portion and a second emission portion, which are formed on the first electrode 502, as shown in FIGS. 2, 5, 7 and 11.

The second electrode 504 is formed on the emission portion 1180, and may be formed of, but is not limited to, ITO (indium tin oxide), IZO (indium zinc oxide), or the like, which is a transparent conductive material such as TCO (transparent conductive oxide). A buffer layer may additionally be provided below the second electrode 504.

An encapsulation layer 1190 is provided on the second electrode 504. The encapsulation layer 1190 serves to prevent water from being permeated into the emission portion 1180. The encapsulation layer 1190 may be formed of a plurality of layers deposited with different inorganic materials, or may be formed of a plurality of layers alternately deposited with inorganic material and organic material. And, an encapsulation substrate 701 may be bonded to the first substrate 501 by the encapsulation layer 1190. The encapsulation substrate 701 may be formed of glass or plastic, or may be formed of metal. A color filter 702 and black matrixes 703 are arranged on the encapsulation substrate 701. The light emitted from the emission portion 1180 advances toward the encapsulation substrate 701 to display an image through the color filter 702.

As described above, according to the present invention, one among the two emission portions includes a green emitting layer or a yellow-green emitting layer and a red emitting layer, whereby green efficiency and red efficiency may be improved, and the color reproduction ratio may be improved.

Also, as one among the two emission portions includes two emitting layers and three EL peaks are provided, efficiency and the color reproduction ratio may be improved, whereby the organic light emitting display device applicable to a large sized TV may be provided.

Also, since the polarizer is not required, the organic light emitting display device having improved luminance may be provided.

Also, since the top emission type is used, the organic light emitting display device having an improved aperture ratio may be provided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic light emitting display device, comprising:
first and second electrodes facing each other on a substrate; and
organic layers between the first electrode and the second electrode, the organic layers including a first emission portion on the first electrode and a second emission portion on the first emission portion,
wherein the first emission portion includes a first hole transport layer, a green emitting layer, a red emitting layer, and a first electron transport layer, wherein the second emission portion includes a second hole transport layer, a dark blue emitting layer, and a second electron transport layer, wherein the red emitting layer is closer to the first electrode than the green emitting layer, wherein the organic layers have a thickness in the range of 200 nm to 230 nm, and wherein the first hole transport layer is between the first electrode and the red emitting layer, and the first electron transport layer is between the green emitting layer and the second hole transport layer.

2. The organic light emitting display device of claim 1, wherein a maximum wavelength of a PL peak of the green emitting layer includes 532 nm, a maximum wavelength of a PL peak of the red emitting layer includes 620 nm, and a maximum wavelength of a PL peak of the dark blue emitting layer includes 444 nm.

3. The organic light emitting display device of claim 1, wherein a combination of the first emission portion and the second emission portion includes electroluminescence (EL) peaks in the ranges of 440 nm to 480 nm, 530 nm to 580 nm, and 600 nm to 650 nm.

4. The organic light emitting display device of claim 1, wherein each of the first electrode and the second electrode includes one among a reflective electrode and a transflective electrode.

5. An organic light emitting display device, comprising:
first and second electrodes facing each other on a substrate; and
first and second electrodes facing each other on a substrate;
a first emission portion on the first electrode; and
a second emission portion on the first emission portion,
wherein the first emission portion includes a green emitting layer and a red emitting layer, and the second emission portion includes a dark blue emitting layer,
wherein the red emitting layer is disposed in a range of 20 nm to 50 nm from the first electrode, the green emitting layer is disposed in a range of 25 nm to 60 nm from the first electrode, and the dark blue emitting layer is disposed in a range of 120 nm to 160 nm from the first electrode,
wherein the first emission portion includes a first hole transport layer and a first electron transport layer, and the second emission portion includes a second hole transport layer and a second electron transport layer, and
wherein the first hole transport layer is between the first electrode and the red emitting layer, and the first electron transport layer is between the green emitting layer and the second hole transport layer.

6. The organic light emitting display device of claim 5, wherein a color change rate based on a viewing angle of the organic light emitting display device includes less than 0.030.

7. The organic light emitting display device of claim 5, wherein a combination of EL peaks of the first emission portion and the second emission portion include wavelengths in the ranges of 440 nm to 480 nm, 530 nm to 580 nm, and 600 nm to 650 nm.

8. The organic light emitting display device of claim 5, further comprising organic layers including the first emission portion and the second emission portion between the first electrode and the second electrode, wherein the organic layers have a thickness in the range of 200 nm to 230 nm.

9. The organic light emitting display device of claim 5, wherein a maximum wavelength of a PL peak of the green emitting layer includes 532 nm, a maximum wavelength of a PL peak of the red emitting layer includes 620 nm, and a maximum wavelength of a PL peak of the dark blue emitting layer includes 444 nm.

10. An organic light emitting display device, comprising:
first and second electrodes facing each other on a substrate; and
organic layers between the first electrode and the second electrode, the organic layers including a first emission portion on the first electrode and a second emission portion on the first emission portion,
wherein the first emission portion includes a first hole transport layer, a dark blue emitting layer, and a first electron transport layer,
wherein the second emission portion includes a second hole transport layer, a green emitting layer, a red emitting layer, and a second electron transport layer,
wherein the red emitting layer is closer to the second electrode than the green emitting layer,
wherein the organic layers have a thickness in the range of 320 nm to 350 nm, and
wherein the first hole transport layer is between the first electrode and the red emitting layer, and the first electron transport layer is between the green emitting layer and the second hole transport layer.

11. The organic light emitting display device of claim 10, wherein a maximum wavelength of a PL peak of the green emitting layer includes 532 nm, a maximum wavelength of a PL peak of the red emitting layer includes 620 nm, and a maximum wavelength of a PL peak of the dark blue emitting layer includes 444 nm.

12. The organic light emitting display device of claim 10, wherein a combination of the first emission portion and the second emission portion includes electroluminescence (EL) peaks in the ranges of 440 nm to 480 nm, 530 nm to 580 nm, and 600 nm to 650 nm.

13. The organic light emitting display device of claim 10, wherein each of the first electrode and the second electrode includes one among a reflective electrode and a transflective electrode.

14. An organic light emitting display device, comprising:
first and second electrodes facing each other on a substrate; and
first and second electrodes facing each other on a substrate;
a first emission portion on the first electrode; and
a second emission portion on the first emission portion,
wherein the first emission portion includes a dark blue emitting layer, and the second emission portion includes green emitting layer and a red emitting layer,
wherein the dark blue emitting layer is disposed in a range of 120 nm to 160 nm from the first electrode, the green emitting layer is disposed in a range of 170 nm to 200 nm from the first electrode, and the red emitting layer is disposed in a range of 200 nm to 230 nm from the first electrode,
wherein the first emission portion includes a first hole transport layer and a first electron transport layer, and the second emission portion includes a second hole transport layer and a second electron transport layer, and
wherein the first hole transport layer is between the first electrode and the red emitting layer, and the first electron transport layer is between the green emitting layer and the second hole transport layer.

15. The organic light emitting display device of claim 14, wherein a color change rate based on a viewing angle of the organic light emitting display device includes less than 0.030.

16. The organic light emitting display device of claim 14, wherein a combination of EL peaks of the first emission portion and the second emission portion include wavelengths in the ranges of 440 nm to 480 nm, 530 nm to 580 nm, and 600 nm to 650 nm.

17. The organic light emitting display device of claim 14, further comprising organic layers including the first emission portion and the second emission portion between the first electrode and the second electrode, wherein the organic layers have a thickness in the range of 320 nm to 350 nm.

18. The organic light emitting display device of claim 14, wherein a maximum wavelength of a PL peak of the green emitting layer includes 532 nm, a maximum wavelength of a PL peak of the red emitting layer includes 620 nm, and a maximum wavelength of a PL peak of the dark blue emitting layer includes 444 nm.

19. An organic light emitting display device, comprising:
first and second electrodes facing each other on a substrate; and
organic layers between the first electrode and the second electrode, the organic layers including a first emission portion on the first electrode and a second emission portion on the first emission portion,
wherein the first emission portion includes a first hole transport layer, a yellow-green emitting layer, a red emitting layer, and a first electron transport layer,
wherein the second emission portion includes a second hole transport layer, a blue emitting layer, and a second electron transport layer,
wherein the yellow-green emitting layer is closer to the first electrode than the red emitting layer,
wherein the organic layers have a thickness in the range of 200 nm to 240 nm, and
wherein the first hole transport layer is between the first electrode and the yellow-green emitting layer, and the first electron transport layer is between the red emitting layer and the second hole transport layer.

20. The organic light emitting display device of claim 19, wherein a maximum wavelength of a PL peak of the yellow-green emitting layer includes 556 nm, a maximum wavelength of a PL peak of the red emitting layer includes 620 nm, and a maximum wavelength of a PL peak of the blue emitting layer includes 456 nm.

21. An organic light emitting display device, comprising:
first and second electrodes facing each other on a substrate; and
organic layers between the first electrode and the second electrode, the organic layers including a first emission portion on the first electrode and a second emission portion on the first emission portion,
wherein the first emission portion includes a first hole transport layer, a yellow-green emitting layer, a red emitting layer, and a first electron transport layer,
wherein the second emission portion includes a second hole transport layer, a blue emitting layer, and a second electron transport layer,
wherein the yellow-green emitting layer is closer to the first electrode than the red emitting layer,
wherein the organic layers have a thickness in the range of 340 nm to 370 nm, and
wherein the first hole transport layer is between the first electrode and the yellow-green emitting layer, and the first electron transport layer is between the red emitting layer and the second hole transport layer.

22. The organic light emitting display device of claim 21, wherein a maximum wavelength of a PL peak of the yellow-green emitting layer includes 556 nm, a maximum wavelength of a PL peak of the red emitting layer includes 620 nm, and a maximum wavelength of a PL peak of the blue emitting layer includes 456 nm.

23. An organic light emitting display device, comprising:
first and second electrodes facing each other on a substrate; and
first and second electrodes facing each other on a substrate;
a first emission portion on the first electrode; and
a second emission portion on the first emission portion,
wherein the first emission portion includes a yellow-green emitting layer, and a red emitting layer, and the second emission portion includes a blue emitting layer,
wherein the yellow-green emitting layer is disposed in a range of 30 nm to 60 nm from the first electrode, the red emitting layer is disposed in a range of 50 nm to 90 nm from the first electrode, and the blue emitting layer is disposed in a range of 120 nm to 160 nm from the first electrode,
wherein the first emission portion includes a first hole transport layer and a first electron transport layer, and the second emission portion includes a second hole transport layer and a second electron transport layer, and
wherein the first hole transport layer is between the first electrode and the yellow-green emitting layer, and the first electron transport layer is between the red emitting layer and the second hole transport layer.

24. The organic light emitting display device of claim 23, further comprising organic layers including the first emission portion and the second emission portion between the first electrode and the second electrode, wherein the organic layers have a thickness in the range of 200 nm to 240 nm.

25. The organic light emitting display device of claim 23, further comprising organic layers including the first emission portion and the second emission portion between the first electrode and the second electrode, wherein the organic layers have a thickness in the range of 340 nm to 370 nm.

26. The organic light emitting display device of claim 23, wherein a maximum wavelength of a PL peak of the yellow-green emitting layer includes 556 nm, a maximum wavelength of a PL peak of the red emitting layer includes 620 nm, and a maximum wavelength of a PL peak of the blue emitting layer includes 456 nm.

* * * * *